US006526841B1

(12) United States Patent
Wanek et al.

(10) Patent No.: US 6,526,841 B1
(45) Date of Patent: Mar. 4, 2003

(54) ENVIRONMENTAL TEST CHAMBER AND A CARRIER FOR USE THEREIN

(75) Inventors: Donald L. Wanek, Rochester, MN (US); Loren L. Swanson, Kasson, MN (US); Richard L. Sands, Rochester, MN (US); Mark Troutman, Rochester, MN (US); James A. Melville, Mantorville, MN (US)

(73) Assignee: Pemstar, Inc., Rochester, MN (US)

( * ) Notice: Subject to any disclaimer, the term of this patent is extended or adjusted under 35 U.S.C. 154(b) by 0 days.

(21) Appl. No.: 09/631,055

(22) Filed: Aug. 1, 2000

Related U.S. Application Data
(60) Provisional application No. 60/146,812, filed on Aug. 2, 1999, provisional application No. 60/146,988, filed on Aug. 3, 1999, provisional application No. 60/158,280, filed on Oct. 7, 1999, and provisional application No. 60/170,939, filed on Dec. 15, 1999.

(51) Int. Cl.[7] .................. G01N 17/00; G01N 25/00; G01R 31/28
(52) U.S. Cl. .................. 73/865.6; 324/760; 374/45
(58) Field of Search .................. 73/865.6, 865.9; 324/760; 361/385; 374/45, 57; 29/445

(56) References Cited

U.S. PATENT DOCUMENTS

| | | | | |
|---|---|---|---|---|
| 2,614,413 A | * | 10/1952 | Alley, Jr. .................. | 73/865.6 |
| 3,302,615 A | * | 2/1967 | Tietje .................. | 73/865.6 X |
| 4,313,679 A | * | 2/1982 | Wolff et al. .................. | 356/244 |
| 4,521,333 A | * | 6/1985 | Graham et al. .................. | 106/18.12 |
| 4,926,118 A | * | 5/1990 | O'Connor et al. .................. | 73/865.6 X |
| 5,021,732 A | | 6/1991 | Fuoco et al. | |
| 5,072,177 A | | 12/1991 | Liken et al. | |
| 5,126,656 A | | 6/1992 | Jones | |
| 5,147,136 A | * | 9/1992 | Hartley et al. .................. | 73/865.6 X |
| 5,195,384 A | * | 3/1993 | Duesler, Jr. et al. .................. | 73/865.6 |
| 5,383,994 A | * | 1/1995 | Shea .................. | 156/175 |
| 5,446,394 A | | 8/1995 | Cassidy | |
| 5,450,018 A | * | 9/1995 | Rieser et al. .................. | 73/865.6 X |
| 5,675,048 A | * | 10/1997 | Hobbs .................. | 73/865.6 |
| 5,721,669 A | | 2/1998 | Becker et al. | |
| 5,767,424 A | * | 6/1998 | Breunsbach et al. .................. | 73/865.9 |
| 5,927,504 A | | 7/1999 | Han et al. | |
| 6,227,701 B1 | * | 5/2001 | Wu .................. | 73/865.8 X |

FOREIGN PATENT DOCUMENTS

| | | | | |
|---|---|---|---|---|
| EP | 617293 A2 | * | 9/1994 | .................. 73/865.6 |
| EP | 0834879 A1 | | 4/1998 | |
| JP | 57-98583 | * | 6/1982 | .................. 201/41 |
| JP | 57-151842 | * | 9/1982 | .................. 73/865.6 |
| JP | 5-172733 | * | 7/1993 | .................. 73/86 |
| JP | 7-140062 | * | 6/1995 | .................. G01N/17/00 |
| SU | 1578596 A1 | * | 7/1990 | .................. 73/865.6 |
| SU | 1251043 A2 | * | 8/1990 | .................. 73/865.6 |
| WO | WO 97/06532 | | 2/1997 | |

OTHER PUBLICATIONS

PCT International Search Report.
PCT International Search Report Published in WO 01/09627 A3 on Mar. 28, 2002.

* cited by examiner

Primary Examiner—Thomas P. Noland
(74) Attorney, Agent, or Firm—Dorsey & Whitney LLP

(57) ABSTRACT

One aspect of the present invention is a system of fabricating a barrier wall between the testing and tester volumes of an environmental test chamber. This aspect may use a plurality of pallets adapted to receive a device under test and a testing apparatus, a framework adapted to receive a plurality of pallets, and a plurality of insulation bricks associated with the plurality of pallets. The insulation bricks may be adapted such that they can cooperate to form an insulating barrier between the device under test and the testing apparatus.

16 Claims, 19 Drawing Sheets

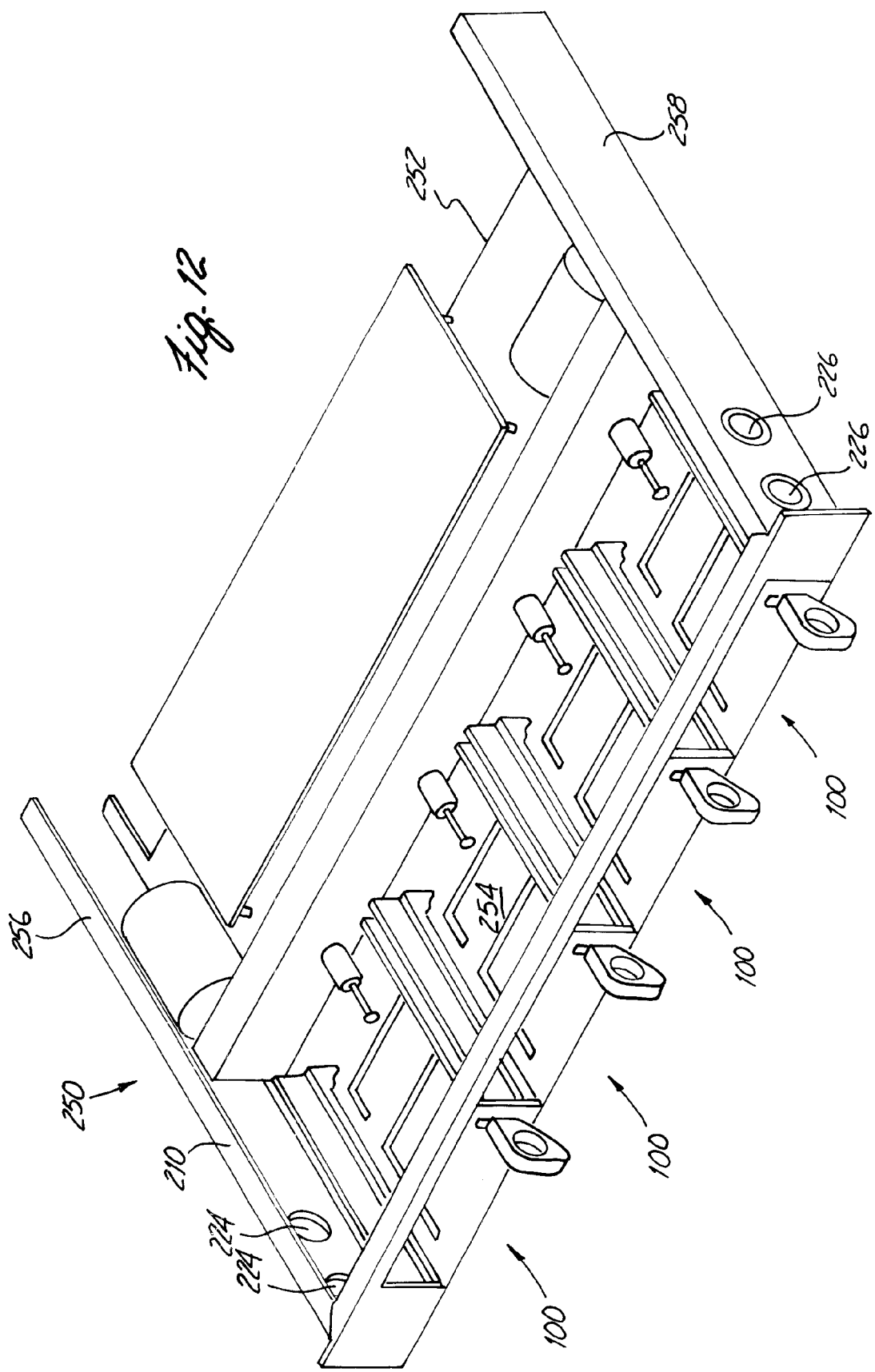

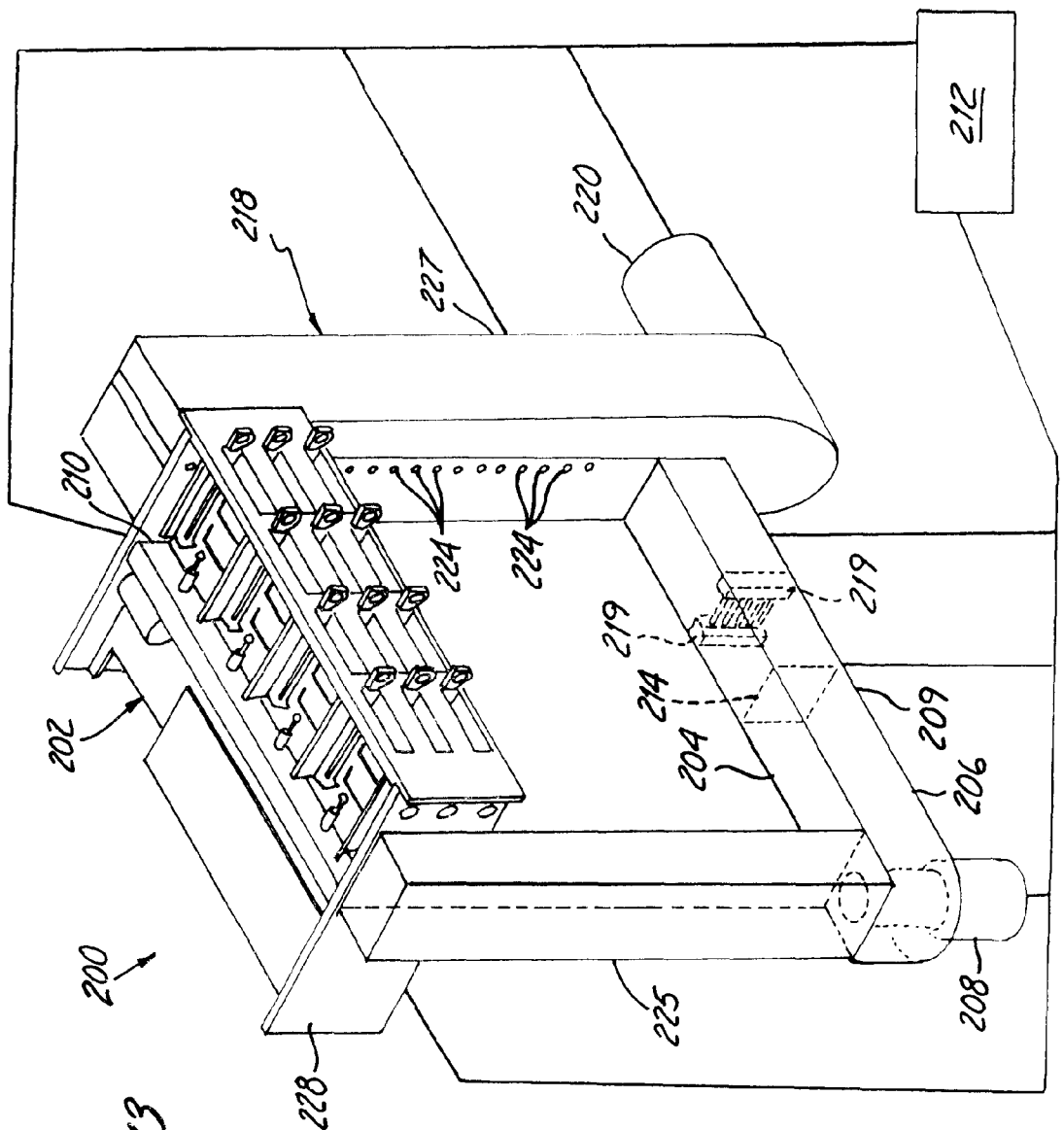

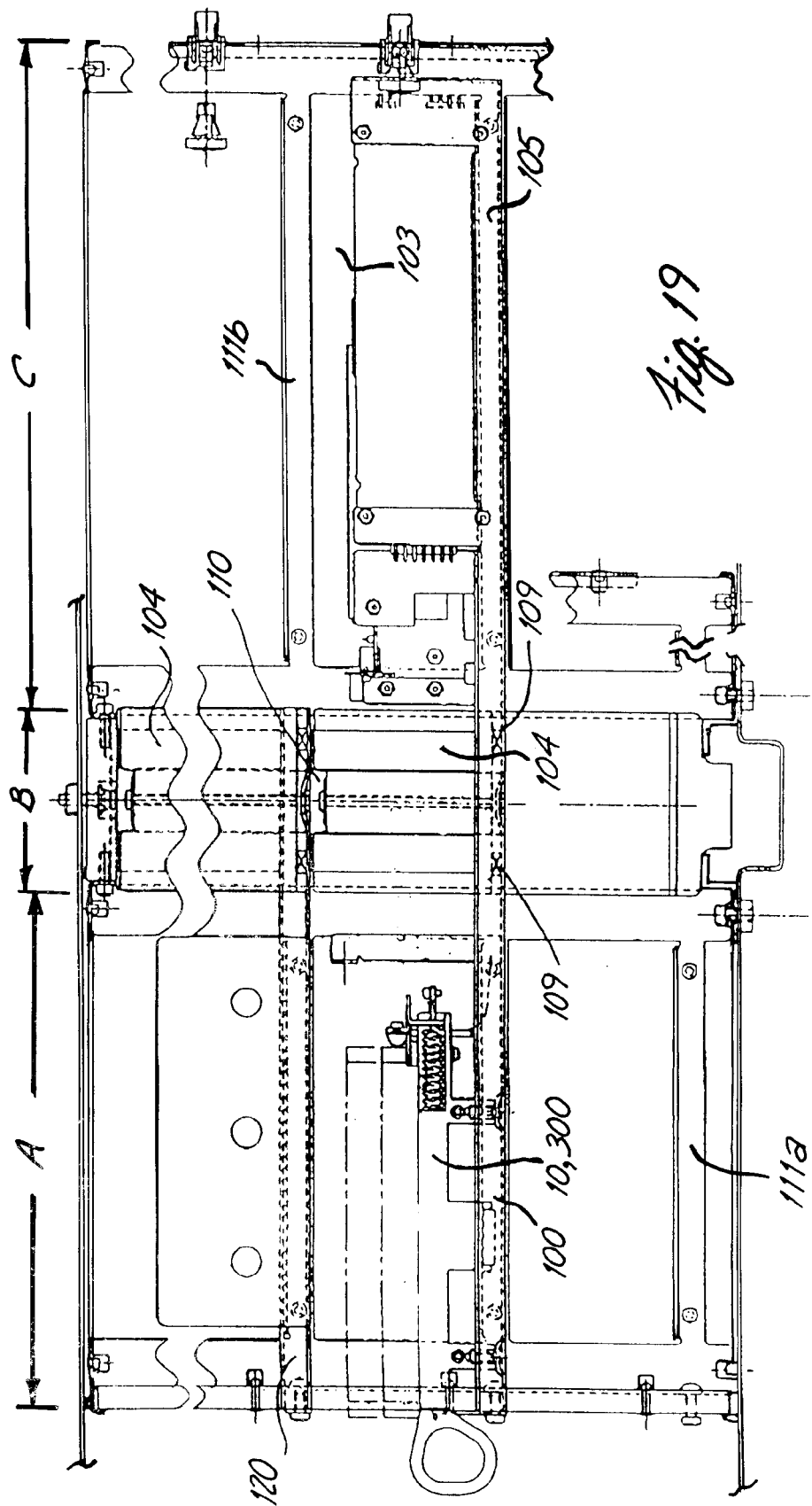

ENVIRONMENTAL TEST CHAMBER AND A CARRIER FOR USE THEREIN

RELATED APPLICATIONS

This application claims priority from Provisional Application No. 60/146,812, filed Aug. 2, 1999; Provisional Application No. 60/146,988, filed Aug. 3, 1999; Provisional Application No. 60/158,280, filed Oct. 7, 1999; and Provisional Application No. 60/170,939, filed Dec. 15, 1999.

TECHNICAL FIELD

This invention generally relates to environmental test chambers and apparatuses for use therein. More particularly, the present invention relates to a hard drive carrier, suitable for use in an environmental test chamber, having improved flexibility, mechanical stability, enhanced maintainability, and thermal uniformity. The present invention also relates to a barrier wall, and a method of construction thereof, for isolating a test area from a pseudo-ambient area in an environmental test chamber. In addition, the present invention relates to an environmental test chamber suitable for individual or small batch testing.

BACKGROUND

Computer hard drives are usually subjected to a "burn in" testing procedure conducted in an environmentally controlled test chamber. These chambers are designed to isolate the drive from vibrations while applying controlled temperature and humidity changes so that the drive manufacturer can obtain accurate test results.

Computer hard drives are also usually subjected to thermal testing or environmental conditioning testing during the design and prototyping phases of the manufacturing process. This testing, also known as "final verification" testing, is also typically conducted in large environmental test chambers. The manufacturer selects the humidity, test temperature, and airflow inside the test chamber so that it simulates the thermal stress range of conditions that the device under test is realistically expected to "see" in its useful life. Alternatively, the humidity, test temperature, and airflow may be selected to be some multiple of the worst expected conditions. These tests can provide a valuable tool to verify product quality and reliability.

To optimize test time during burn-in and during final verification testing, the disk drive should be heated or cooled at a defined rate until the specific desired test temperature is reached while applying specified humidity. Accordingly, it is important to maintain a specific airflow over the drive during this phase to ensure that temperature gradients within the drive are typical of the end use environment. The airflow through the test chamber must also be sufficient to ensure a consistent humidity and temperature variance throughout the chamber while dissipating the heat generated during the tests by the operating device (typically about thirty watts per a disk drive), but not at a level at which excessive localized cooling would fail to simulate the final operational environment of the devices under test.

Conventional environmental test chambers consist of one or two chambers. One chamber provides a controlled environmental space for the items under test (the "testing chamber"), and is designed to provide heat and cool large numbers of disk drives, typically about 120 drives at a time. There is generally no feedback control from the drives, the control of the overall chamber temperature being the preferred mode of operation. Accordingly, significant temperature variations can and do occur within the testing chamber, which result in different temperatures for drives at different locations. Another problem with conventional environmental test chambers is that all of the files in the chamber are heated/cooled together. Thus, these systems are inherently designed for batch processing.

The second "tester" chamber, if included, typically provides a space for the tester hardware (in single chamber devices, the tester hardware is simply left out in the ambient air). The divider between the testing and tester chambers has customarily been a solid metal wall, with insulated electrical or other "as-needed" connections made via permanent holes in the wall. This solid metal wall severely limits the flexibility of applications and makes any alteration to accommodate different applications a time consuming and expensive process. The solid metal wall also allows significant heat transfer between the two chambers.

The drives are typically held in a fixture or a carrier while they undergo the burn-in or final verification testing procedures. One problem with conventional fixtures or carriers is that they are prone to transferring mechanical vibrations to the drive under test. Conventional holders or fixtures also fail to provide good air circulation around the drive, contributing to thermal gradients of as much as thirty degrees Celsius. Both of these conditions are undesirable because they add noise to the test results and generally reduce the utility of the environmental test chamber.

Another problem with current carrier designs is that they lack "user friendliness." These designs typically use a "swing type" or "barn door" latch that requires a large rotational motion to engage or disengage the point clamping site with the drive. These latching mechanisms also do not provide clear access to both ends of the drive when the latch is open. These problems can interfere with cable connection and arrangement.

Yet another problem with current carrier designs is that they are relatively expensive because they require a large amount of raw materials and a large number of parts. This problem is compounded because conventional carrier designs are custom designed for a single use. For example, carriers built to test 3.5" disk drives could not be used with 2.5" drives. These problems increase the manufacturing and assembly cost of the carrier. Lack of flexibility is also a problem in for users who need to test a variety of devices, such as small batch manufacturers and research facilities.

Ideally, an environmental testing chamber and carrier testing station should individually subject each device under test to its required environment, should allow for accurate and precise control of the environment, and should allow the devices under test to be loaded/unloaded individually for a continuous flow of products through the testing station. This ideal, however, must be weighed against its cost of implementation.

Clearly, there is a need for more flexible environmental test chamber and hard drive carrier capable of accommodating different applications. There is also a need for a simple and inexpensive hard drive carrier that reduces vibration and improves airflow around the drive. In addition, there is a need for a more user friendly hard drive carrier that simplifies clamping/unclamping and that provides clear access to the ends of the drive at all times.

SUMMARY

The present invention provides an environmental test chamber and a carrier capable of accommodating different devices under test. One aspect of the present invention includes the concept of designing "pallets" to carry components from both the tester and tested device. These pallets may include "bricks" that each form a portion of the barrier wall between the test environment and tester space. This brick and pallet system provides for easy construction of a thermal barrier and permits great flexibility and versatility in overall design.

Another aspect of the present invention is a system of fabricating a barrier wall between the testing and tester volumes of an environmental test chamber. One embodiment of this system comprises a plurality of pallets adapted to receive a device under test and a testing apparatus, a framework adapted to receive the plurality of pallets in a manner permitting a balance between a maximized number of pallets and obtaining suitable airflow and temperature uniformity in the test volume, and a plurality of insulation bricks associated with the plurality of pallets. The insulation bricks cooperate to form an insulating barrier between the device under test and the testing apparatus. The insulation bricks also cooperate to form a plenum capable of being purged by an appropriate heated purge gas flow.

Yet another aspect of the present invention is an environmental test chamber suitable for individual or small batch testing. One embodiment comprises a test volume having an inlet; an air delivery system adapted to deliver a flow of air to the inlet; and a drawer, received in the test volume and in pneumatic communication with the inlet. Another test chamber embodiment comprises an air delivery system adapted to deliver air to a test volume and a plurality of drawers received in the test volume and in pneumatic communication with the air delivery system.

Still another aspect of the present invention is a method of testing a plurality of electrical components. This method may comprise the acts of operably connecting a first electrical component to a first test drawer; inserting the first test drawer in a test unit; operably connecting a second electrical component to a second test drawer; and inserting the second test drawer in the test unit. The test unit in this embodiment may either subject the first electrical component and the second electrical component to similar environmental conditions or may simultaneously subject them to different environmental conditions.

The present invention also provides a simple and inexpensive hard drive carrier that reduces vibrations, improves airflow around the drive, simplifies clamping/unclamping, and provides clear access to the ends of the drive at all times. One embodiment comprises a frame defining a test bed, a clamp pad moveably connected to the frame, a cam operably connected to the clamp pad and adapted to actuate the clamp pad into operable engagement with a hard drive. Some embodiments may also comprise an electrical assembly attached to the frame, the electrical assembly being adapted to communicate signals to and from the hard drive. The carrier may also have a first side member and a second side member that allow the same carrier to receive and releasibly hold both 2.5 inch drives and 3.5 inch hard drives. The hard drive carrier of the present invention is particularly suitable for use with the environmental test chamber.

Another aspect of the invention is a carrier apparatus adapted for testing different sized devices under test. One embodiment comprises a first test bed adapted for operable connection with a first device under test; and a second test bed adapted for operable connection with a second device under test; wherein the first device under test is larger than the second device under test. Another embodiment comprises a frame; and a clamp operably attached to the frame and adapted to selectively hold a first device under test and a second device under test; wherein the first device under test is larger than the second device under test. In these embodiments, the first device under test may be a 3.5 inch hard drive and the second device under test may be a 2.5 inch hard drive.

One feature and advantage of the present invention is that it provides a dual chamber environmental test chamber system that is easily adapted for use with different devices under test. Another feature and advantage is an improved carrier having reduced mass, increased stiffness, and greater omni directional airflow around the drive. This carrier also provides a simple pull/push or pull/push/twist motion to unclamp, to eject, and to prepare to reclamp another drive for test. In addition, the carrier provides clear access to the ends of the drive at all time, thus simplifying cable connections. Yet another feature and advantage is that the present invention provides a practical, implementable, multi-drive test chamber testing system and design that provides improved uniformity of temperature control, environmental condition variation throughout the chamber by design, product testing flexibility, and capability for small batch and/or single "unit" testing. These and other features, aspects, and advantages will become better understood with reference to the following description, appended claims, and accompanying drawings.

BRIEF DESCRIPTION OF THE DRAWINGS

FIG. 12 is an isometric view of a carrier drawer embodiment for use with the dual plenum temperature control system.

FIG. 13 is an isometric view of an environmental test chamber embodiment having a dual plenum temperature control system.

FIG. 19 is an elevational side view of an environmental test chamber frame embodiment.

DETAILED DESCRIPTION

The accompanying figures and this description depict and describe embodiments of the present invention, and features, aspects, and components thereof. With regard to means for fastening, mounting, attaching or connecting the components of the present invention to form the mechanism as a whole, unless specifically described otherwise, such means are intended to encompass conventional fasteners such as machine screws, nut and bolt connectors, machine threaded connectors, snap rings, screw clamps, rivets, nuts and bolts, toggles, pins and the like. Components may also be connected by welding, adhesives, friction fitting or deformation, if appropriate. Electrical connections or position sensing components may be made using appropriate electrical components and connection methods, including conventional components and connectors. Unless specifically otherwise disclosed or taught, materials for making components of the present invention are selected from appropriate materials such as metal, metallic alloys, fibers, plastics and the like, and appropriate manufacturing or production methods including casting, extruding, molding and machining may be used. In addition, any references to front and back, right and left, top and bottom and upper and lower are intended for convenience of description, not to limit the present invention or its components to any one positional or spacial orientation.

I. Hard Drive Carrier

Figure 1:
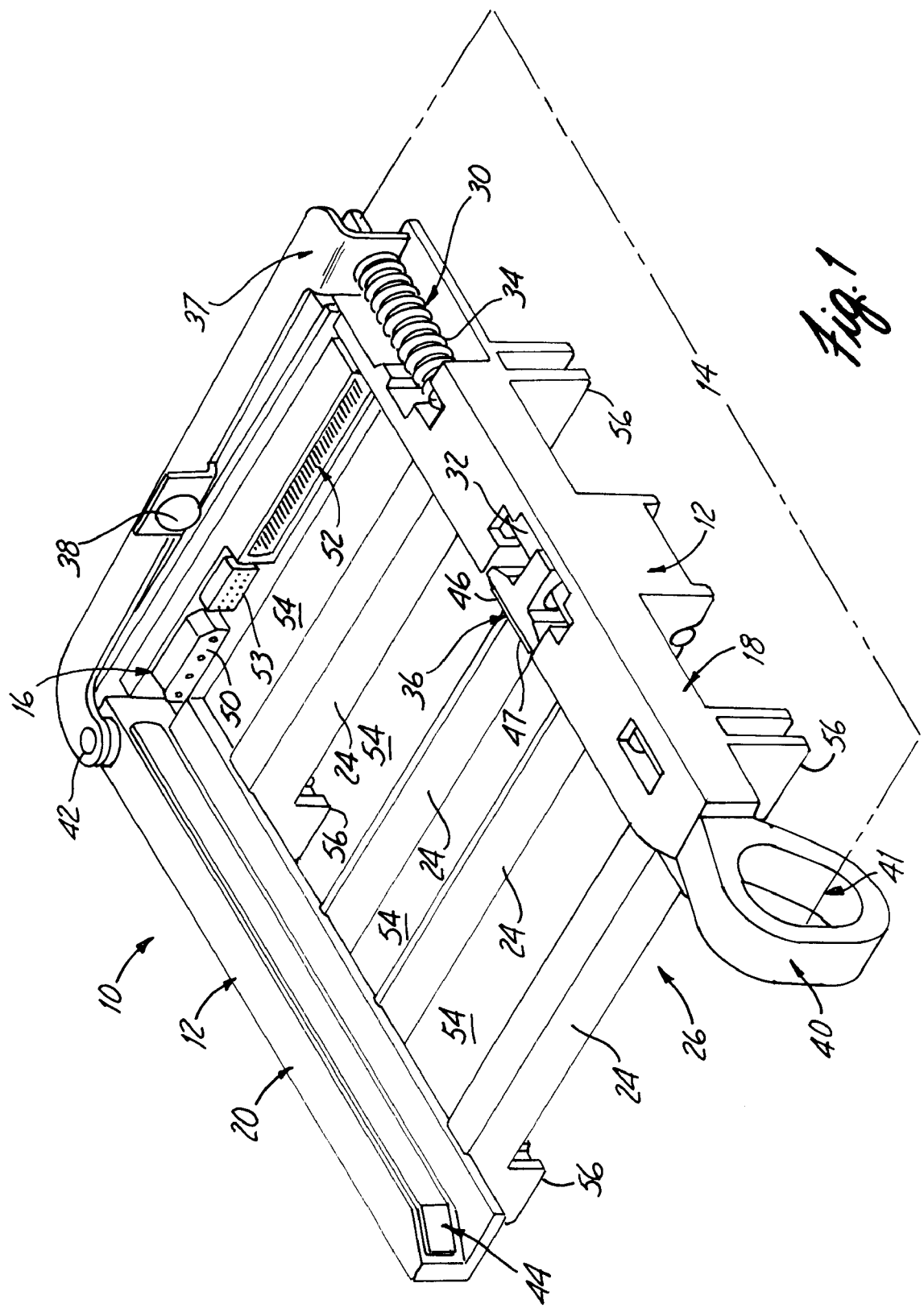
FIG. 1 is a perspective view of one carrier embodiment showing the top, right, and front faces.

FIG. 1 is a perspective view of the top, right, and front sides of one carrier embodiment 10. The carrier 10 includes a frame 12, a clamping mechanism 14, and a connector bar 16. The frame 12 comprises an "L" shaped right side frame member ("right side bar") 18, a left side frame member ("left side bar") 20 that is generally parallel to and coplanar with the right side bar 18, and a plurality of generally transverse cross members ("cross bars") 24 that cooperate with the right side bar 18 and the left side bar 20 to define a rectangular test bed 26. The clamping mechanism 14 in this embodiment comprises a cylindrical operating rod 30, a linear cam 32, a linear return spring 34, a clamp pad 36, an ejection lever 37, an ejection bumper 38, a non-interfering handle 40, and a hinge 42. The connector bar or module 16 comprises a variety of electrical connections, such as a power supply port 50, an I/O port 52, and a configureable jumper port 53.

In operation, the user may first eject a previously tested drive (the "old drive," not shown) by pulling the handle 40 outward, away from the frame 12. This pulling of the handle 40: (i) causes the clamp pad 36 to move away from and out of engagement with the drive's right side surface, which frees the drive; and (ii) causes the ejection lever 37 to pivot inwardly around the hinge 42, toward the old drive's rear surface, which causes the ejection bumper 38 to first contact and then push the old drive out of engagement with the connector bar 16. The handle 40 may now be released, coming to rest in a position where the clamp pad 36 is in a withdrawn position. That is, the operating rod 30, with its linear cam 32, automatically returns to an intermediate position ("home") determined by the maximum extension of the return spring 34. The old drive can now be removed and replaced with the next drive to be tested (a "new drive," not shown). The new drive should be inserted into test bed 26 with sufficient force so that it engages the connector bar 16, thus electrically connecting the new drive's electrical ports to the corresponding ports on the connector bar 16. The handle 40 is then pushed toward the frame 12 into a clamping position, which causes the clamp pad 36 to engage and to lock the new drive in the test bed 26.

The frame 12 in some embodiments comprises a plurality of cross members 24. These cross members 24 are designed to maximize the carrier's stiffness, yet allow for excellent omni-directional air flow. In some embodiments of the present invention, the cross members 24 may be a combination of beams having "U" shaped cross sections, "T" shaped cross sections, and/or rectangular cross sections. These embodiments are desirable because the cross members 24 define four air flow apertures 54. These apertures 54 allow temperature and humidity controlled air to flow around the bottom and side surfaces of the drive during a test. Embodiments having "U" and "T" shaped cross sections may be particularly desirable because they can provide greater stiffness than a rectangular cross section of similar weight. This allows the manufacturer to use less material, which reduces their cost of manufacturing, reduces the physical workload involved in a test chamber operation, and increases the size of the apertures 54. Some embodiments may also include one or more diagonal cross members 24 (not shown) that further increase the carrier's stiffness.

In some embodiments, the cross members 24 may also define four supports or legs 56. These supports 56 are desirable because they further enhance air flow across the bottom surface of the drive, which helps to reduce thermal gradients and to increase heat transfer. These supports 56 should be sufficiently strong to hold the combined weight of the drive and the carrier 10 and should be relatively wear resistant. However, embodiments without these supports 56 are also within the scope of this invention.

The frame 12 may be made from any material with relatively good stiffness. One suitable material is cold rolled steel. This material is desirable because it is relatively inexpensive, is easy to machine, and does not outgas. However, other materials are within the scope of the present invention. These include, without being limited to, grey cast iron, hot rolled steel, aluminum, polyethylene, polyvinyl chloride. Dissipative plastics may also be desirable because they are lightweight, relatively inexpensive, and help to further isolate the device under test from vibrations.

The handle 40 in this embodiment of the present invention has a generally vertical orientation and is designed so that it does not interfere with access to the front of the hard disk drive. This handle 40 embodiment is desirable because it allows for easier connection and arrangement of cables. This handle 40 embodiment is also desirable because it provides a relatively large opening 41 without interfering with drive insertion and removal. However, other handle 40 configurations, orientations, and positions are within the scope of this invention. This specifically includes, without being limited to, a handle 40 specially adapted for automated or robotic handling.

The clamp pad 36 in this embodiment has a relatively large clamping surface 46, which helps to reduce the potential of mechanical motion of the drive relative to the frame 12. The clamping pad 36 may be also fabricated from a resilient vibration damping material or may have a strip 47 of this material attached to the clamping surface 46. One suitable vibration damping material is manufactured by Aero E.A.R. Specialty Composites with a part number of C-1002-06 PSA. These embodiments are desirable because the vibration damping material reduces test noise, thus improving the test results. However, clamping pads 36 made from other materials and/or without the vibration damping strip 47 are within the scope of this invention.

The clamping mechanism 14 in some embodiments may include a rotatable joint (not shown), such as an eye bearing, that allows the clamp pad 36 to engage a drive of the drive's orientation (i.e., allows the clamp pad 36 to provide clamping force in a 180 degree range). These embodiments are desirable because they automatically allow the carrier 10 to hold non-rectangular devices under test.

The drive ejection bumper 38 is designed and located to provide a compliant, yet firm, contact with a wide variety of drives so that it can facilitate their removal from the carrier 10. One suitable material is a solid, but relatively compliant, elastomeric material, such as rubber. However, other materials and designs, such as a foamed polymer bumper or an air filled bumper, are within the scope of this invention.

The connector bar 16 in some embodiments may contain a single port or a plurality of ports 50, 52 and 53 that are designed to engage corresponding connector port(s) located on the drive. These ports 50, 52, and 53 provide power to the drive and could transmit information to and from the drive.

Figure 2:
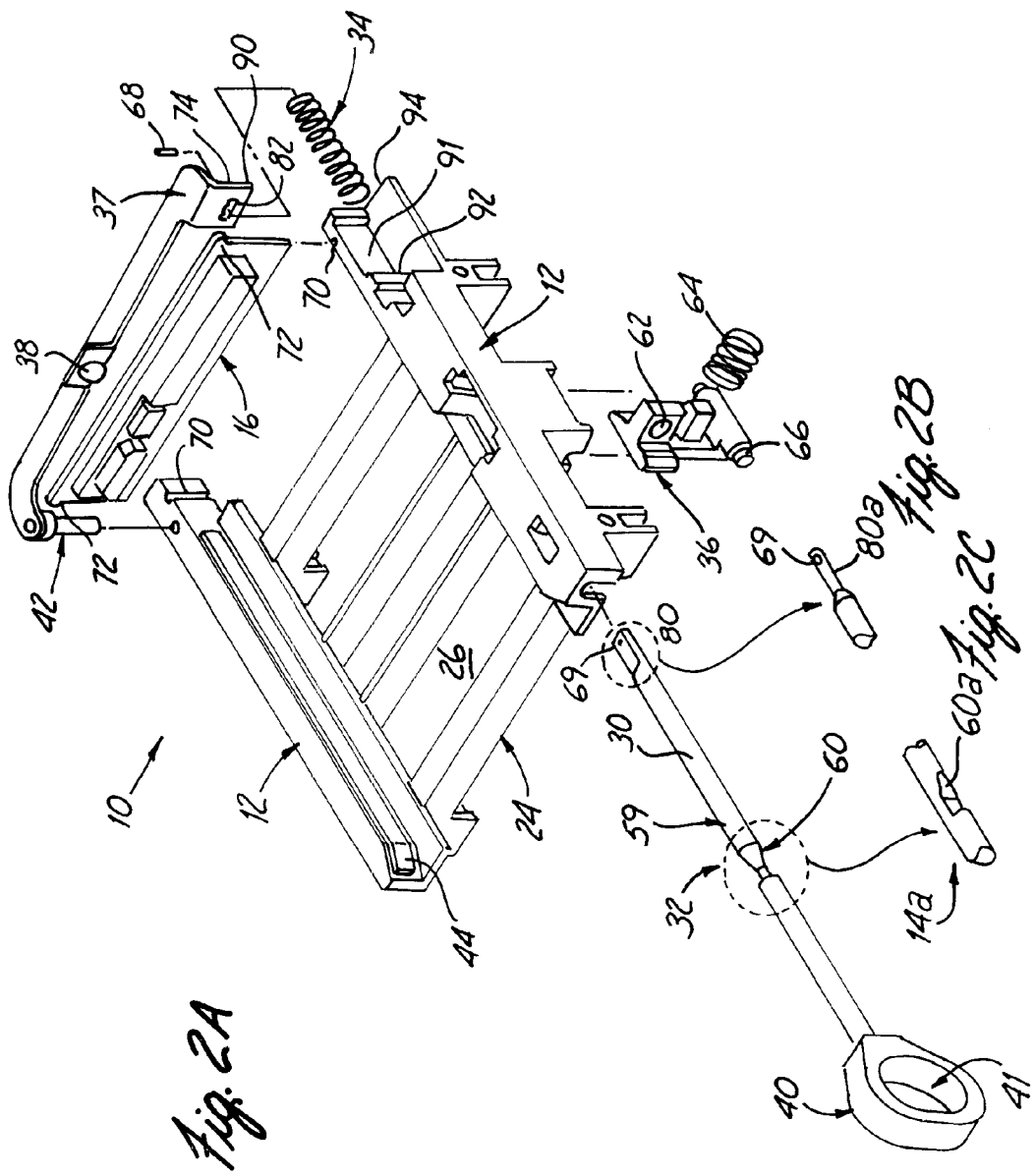
FIG. 2A is an exploded view of two a clamping and release mechanism embodiments
FIG. 2B is a detailed view of a portion of an operating rod, according to one embodiment of the present invention.
FIG. 2C is a detailed view of an alternate clamping and release mechanism.

The connector bar 16 in some embodiments is removably attached to the frame 12 by suitable means, such as a groove 70 designed to accept a portion of the connector bar 16 below fingers 72 (FIG. 2A). These "modular" connector bars 16 are desirable because the carrier 10 may be quickly configured to engage drive types and models that use different bus interfaces, such as IDE, PCI, ATA, or SCSI. That is, users can easily attach different, interchangeable connector bars 16 to the frame 12 whenever the user needs to test drives having a particular interface. Despite this advantage, however, connector bars 16 that are permanently attached to the frame 12 are also within the scope of this invention.

The right side bar 18 and the left side bar 20 in this embodiment include a pressure strip 44 of metal-covered vibration damping material. One suitable pressure strip 44 is manufactured by Aero E.A.R. Specialty Composites with a part number of SB-40-ALPSA. This pressure strip 44 is desirable because it provides good wear resistance and reduces vibrations. However, carriers 10 without this pressure strip 44 or with a pressure strip 44 made from other materials capable of damping vibration and resisting wear are within the scope of this invention.

FIG. 2A is an expanded view showing a first embodiment of the clamping mechanism 14. FIG. 2A comprises an operating rod 30 having large diameter section 59 and a grooved section 60 that combine to form the linear cam 32. The diameter of the large diameter section 59 is designed such that the operating rod 30 can slide freely through a hole 62 in the clamping pad 36. FIG. 2A also shows an actuating spring 64 and a hinge pin 66.

In operation, the grooved section 60 is aligned with the hole 62 when the operating rod 30 is in a fully inserted or "clamping" position. In this position, there is sufficient space between the operating rod 30 and the hole 62 such that the actuating spring 64 can pivot the clamping pad 36 around the hinge pin 66 and into engagement with the hard drive. That is, the actuating spring 64 can bias the clamping pad 36 against the hard drive when the grooved section 60 is laterally aligned with the hole 62. Sliding the operating rod 30 out of the "clamping position" laterally aligns the wide diameter portion 59 of the operating rod 30 with the hole 62. In this position, the wide diameter section 59 of the operating rod 30 engages the interior surface of hole 62 and prevents the actuating spring 64 from biasing the clamping pad 36 against the drive. That is, the operating rod 30 prevents the clamping pad 36 from engaging the drive whenever the grooved section 60 is not aligned with the hole 62.

The operating rod 30 in this embodiment also comprises a flat section 80 that is adapted to slide freely through a slot 82 in the ejection lever 37. A pin 68 fits into a corresponding hole 69 in the flat section 80. Pulling the operating rod 30 from the clamping position to a partially inserted or "home" position causes the flat section 80 to laterally slide through the slot 82. This, turn, causes the pin 68 to engage a back face 74 of the ejection lever 37. Continuing to pull the operating rod 30 from the home position to a substantially withdrawn or "ejection" position causes the pin 68 to exert a force against the back face 74 of the ejection lever 37. This force pivots the ejection lever 37 around the hinge 42 in a clockwise direction (as depicted in FIG. 2A), which, in turn, biases the ejection bumper 38 against the drive. The force from the ejection bumper 38 pushes the drive out of engagement with the connector bar 16. Thus, pulling the operating rod 30 from the clamping position to the ejection position releases the clamp and biases the drive away from the connector bar 16.

Moving the operating rod 30 from the home position to the ejection position also causes a flange 90 on the ejection lever 37 to compress the return spring 34 against the frame 12. When the operator releases the handle 40, the return spring 34 produces a force that pivots the ejection lever 37 around the hinge 42 in a counterclockwise direction (as depicted in FIG. 2A). The ejection lever 37, in turn, biases the operating rod 30 from the ejection position to the home position.

The flange 90 is designed to slide in a slot 91 between two stops 92 and 94. The front stop 92 prevents the operating rod from being pulled too far out of the frame. The rear stop 94 is positioned so that it engages the flange 90 when the operating rod 30 returns to the home position from the ejecting position. This prevents the ejection lever 37 and the return spring 34 from exerting force on the operating rod 30 between the home position and the clamping position. That is, the stop 94 isolates the operating rod 30 from the return spring 34 between the home position and the clamping position. After the flange 90 hits the stop 94, the operating rod 30 may continue to be pushed through the slot 82 from the home position to the clamping position.

In a second embodiment clamping mechanism embodiment, the operating rod 30 may also be contoured along its length to form the linear cam 32. In this embodiment, the sections having a greater diameter may force the clamp pad 36 to move "inward" into the test bed and into contact with the hard disk drive. The portions of the operating rod having a smaller diameter may allow the clamp pad 36 to move "outward," which releases the hard drive. The greater diameter sections in these embodiments are positioned along the length of the operating rod 30 such that the clamp pad 36 is forced to engage the drive when the handle 40 is in the "pushed in" or "clamping" position. The smaller diameter sections are positioned along the length of the operating rod 30 such that the clamp pad 36 can release the hard disk drive when the handle 40 is in the "home" and "ejection" positions.

The return spring 34 may also be used in the second embodiment to actuate the handle 40 from an "ejection" position to a "home" position. It is desirable, however, that the return spring 34 be configured so that it does not disengage the clamp pad 36 from the drive. In some embodiments, this may be accomplished by designing the spring's "neutral" position to correspond to the handle's "clamping" position. It is also desirable that the chosen spring constant be low enough, or that the spring 34 be counter-balanced by a second spring (not shown), so as to prevent the return spring 34 from actuating the operating rod 30 into those positions where the greater diameter sections engage the clamp pad 36. Other springs 34 and mechanisms that are capable of actuating the handle 40 from the "withdrawn" position to the "home" position and that do not disengage the clamping mechanism 14 during use are also within the scope of this invention.

One advantage of these two carrier 10 embodiments is that the loading, clamping, and ejection mechanisms are all operated by one rod using a simple push/pull motion. This simple push/pull operation of the clamping mechanism 14 may minimize the risk of repetitive motion conditions, such a carpal tunnel syndrome, when compared to the rotational sweep clamping mechanisms found in conventional industry designs.

FIG. 2C shows a third cam mechanism embodiment 14*a* that is partially actuated using rotational motion, which may be desirable for use with robotic loading/unloading devices. The machined portions 60*a* of rod 30 in these embodiments act as a rotary cam, rather than a linear cam. That is, the machined area 60*a* will have a large diameter arc and a small diameter arc. Rotating the handle 40 by about ninety degrees in either the clockwise or counterclockwise direction will cause the large diameter arc to alternately engage and disengage the interior surface of the hole 62, which, in turn, will latch and unlatch the clamping mechanism 36. Those skilled in the art will recognize that embodiments using this rotational cam mechanism 14*a* may replace the flat section 80 with a round finger 80*a*, as depicted in FIG. 2B. This finger 80*a*, like the flat section 80, should be sized to fit into the slot 82 and should have a hole 69 capable of receiving the pin 68.

Figure 3:
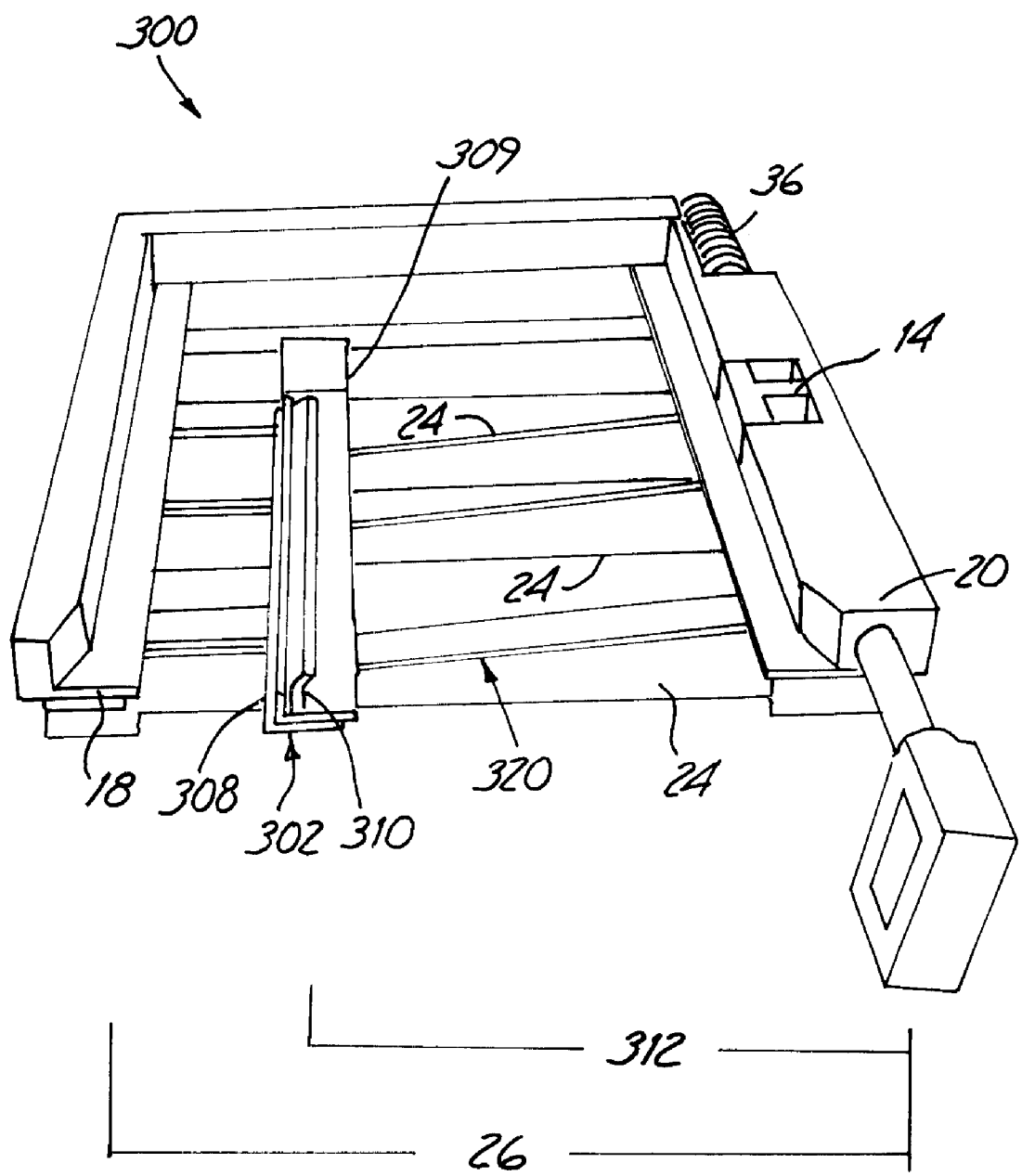
FIG. 3 is an isometric view of a carrier embodiment adapted to receive multiple drive sizes.
Figure 4:
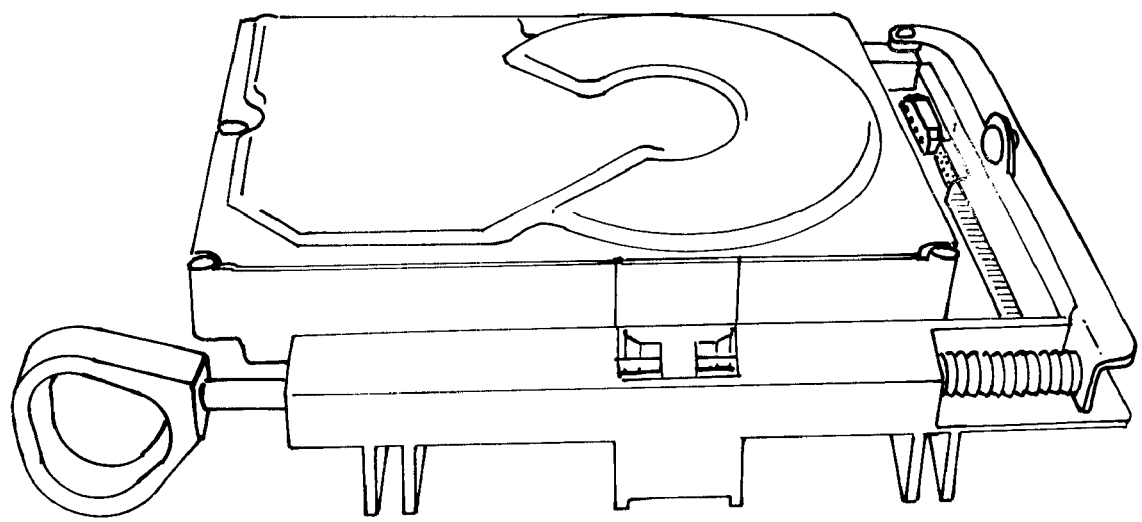
FIG. 4 is a perspective view of one embodiment of the present invention showing a hard drive being inserted into the test bed and a handle in a "home" (load/unload) position.
Figure 5:
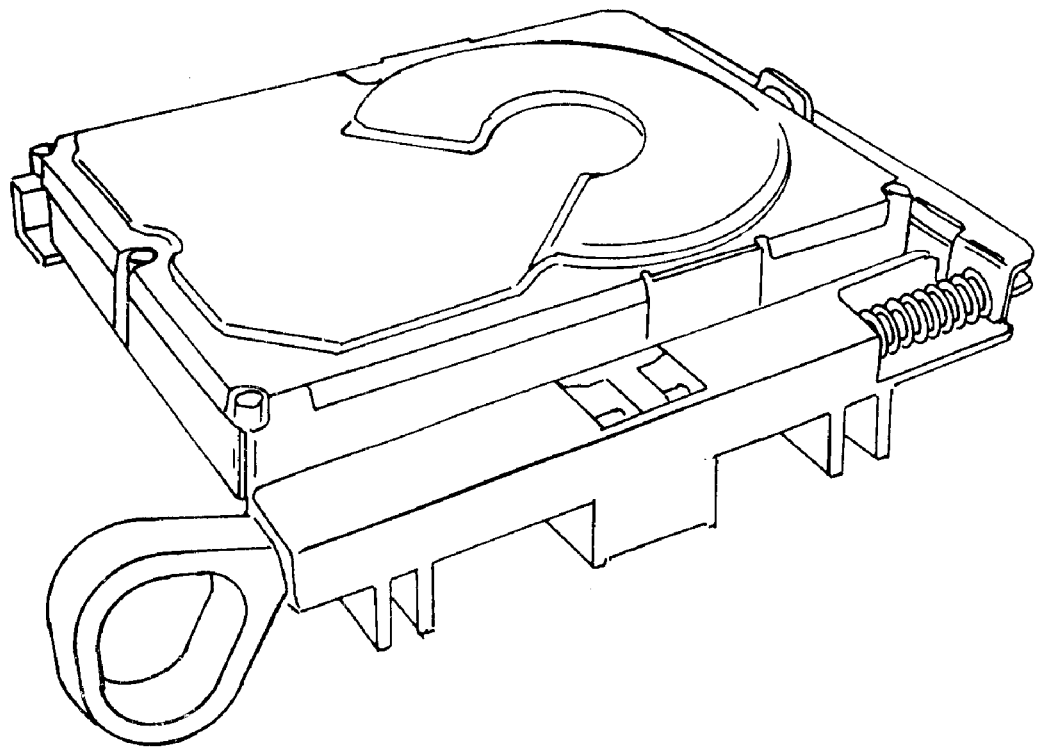
FIG. 5 is a perspective view of one embodiment of the present invention showing a hard drive fully inserted into the test bed and the handle in a "clamping" position.

FIG. 3 is an isometric view of a carrier embodiment 300 adapted to receive and test both 2.5" and 3.5" hard disk drives. This carrier embodiment 300 includes a second, intermediate L-shaped bar 302 that is generally parallel with, but vertically offset ("recessed") from, the right side bar 18 and the left side bar 20. The intermediate side bar 302 in this embodiment has a generally vertical side surface 304, a pressure strip 306 adhesively attached to the generally vertical side surface 304, a top surface 308, a rear locator surface 309, and a generally horizontal or slightly inclined bottom surface 310. The carrier 300 also comprises three crossbars 24 having an angled notch 320 that generally extends between the intermediate bar 302 and the right side bar 20. The angled bottom surface 310, the angled notch 320, and the right side bar 20 cooperate to define a second rectangular test bed 312. The carrier embodiment 300 in FIG. 3 may use either the linear latch system or the rotary latch system described with reference to FIGS. 2A–2B.

In operation, when the carrier 300 is used with 3.5" drives, it operates similar to the carrier embodiment 10 described with reference to FIGS. 1–2 and 4–5. More specifically, the 3.5" drive sits in the first rectangular test bed 26 in a generally horizontal position and is held in place by the left side bar 18 and the right side bar 20. Because the top surface 308 of the intermediate bar 302 is coplanar with or below the horizontal surface 314 of the left side bar 18, the intermediate bar 302 does not affect the insertion, testing, or removal of a 3.5" drive.

2.5" drives are inserted into the second rectangular test bed 312, between the intermediate side bar 302, the right side bar 20, and the rear locator surface 309. Because the intermediate side bar 302 is recessed below the left side bar 18, the 2.5" drive will sit in the second rectangular test bed 312 at an acute angle to the horizontal. That is, the 2.5" drive will rest in and be aligned with the notch 310. Actuating the clamping mechanism causes the clamp pad 36 to pivot around the rotatable joint (not shown) and to engage the side of the drive, which clamps the drive in the inclined position.

The carrier embodiments in FIGS. 1–5 offer many advantages over the art. These advantages include excellent vibration reduction, minimal airflow restriction, and single cam operation (i.e., clamp, probe and latch). Some carrier embodiments also: (i) allow for both automated and manual loading; (ii) can switch rapidly between different drive sizes; and (iii) can switch rapidly between different I/O standards.

II. Modular Pallets

Another aspect of the present invention is the use of a "building block" approach to eliminate the limitations associated with the "classic" methods of constructing environmental chambers and to provide an environmental test chamber that is both flexible and easy to assemble.

Figure 6:
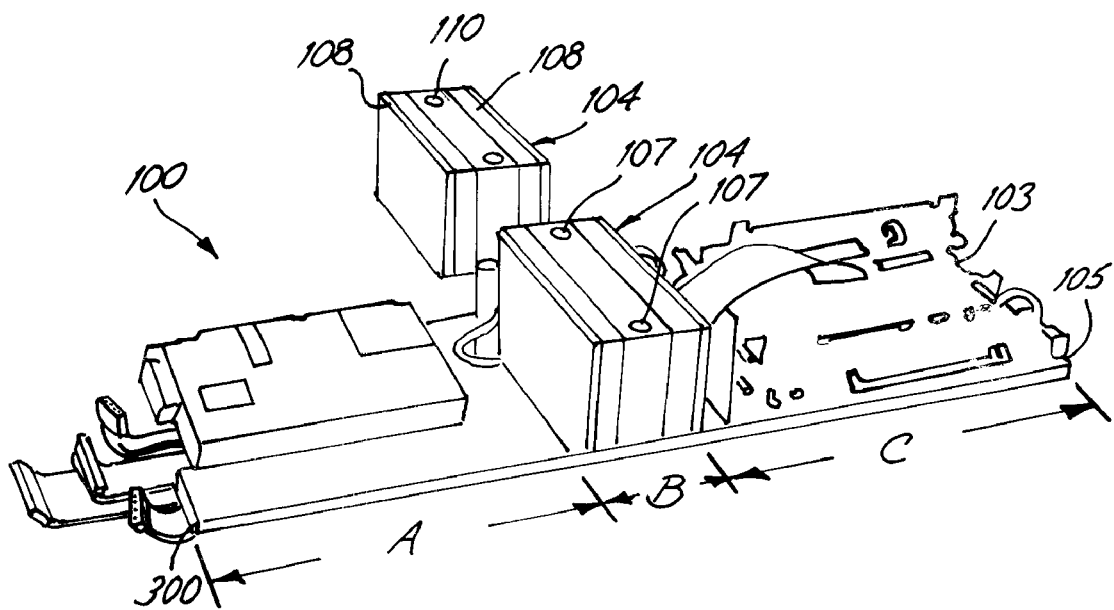
FIG. 6 is a perspective view of an environmental test chamber pallet embodiment showing the top and right sides.
Figure 7:
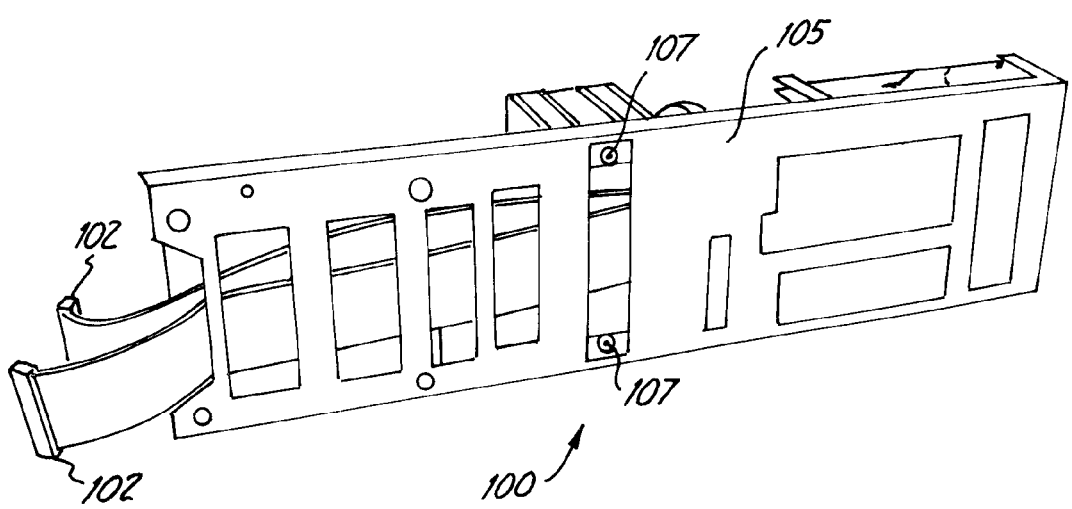
FIG. 7 is a bottom view of an environmental test chamber pallet embodiment of FIG. 6.

FIG. 6 shows a modular "carrier pallet" embodiment 100. These pallets 100 are adapted to fit into a front frame 111*a* and a rear frame 111*b* that define a plurality of interior receiving slots 106*a* and exterior receiving slots 106*b* (see FIGS. 8, 9, and 10). Each pallet 100 comprises an insulating/air plenum brick 104 connected to a base plate 105 by one or more bolts 107. The brick 104 in this embodiment defines a testing space (A), a wall space (B), and a tester space (C). The test space (A) is designed to accommodate a fixture for holding the device under test, such as the holding fixture 10 or 300, and to allow connection to a test driving electronic package 103 via flat cable(s) 102 (FIG. 7). The tester space (C) is likewise designed to allow easy mounting of, and connection to, the tester driving components 103. The wall space (B) is designed to minimize the quantity of metal and other conductive materials, thus minimizing thermal transfer between A & C, commiserate with maintaining appropriate rigidity and mechanical integrity of the entire pallet.

In operation, when multiple loaded pallets 100 are inserted into slots 106, the sides of the bricks 104 seal against each other and against the walls of the test chamber. Thus, as shown in FIG. 19, the bricks 104 in the different pallets cooperate to form a complete insulating barrier ("wall") between the devices under test and the test driver components. That is, each brick 104 in an interior slot 106*a* will seal against the bricks 104 on the pallet 100 immediately above it, below it, to its left, and to its right (i.e., its "neighboring bricks"). Each brick 104 in an exterior slot 106*b* will seal against the side of the environmental test chamber and three neighbor bricks 104. Users will continue to fill the slots 106 until the entire wall is complete.

In some embodiments, the wall may be completely formed using the pallets 100 depicted in FIG. 6. In other embodiments, the wall may be partially formed using these pallets 100 and completed by the user of "filler pallets" 120 similar to those shown in FIGS. 6–9, but without the device under test or the electronic testing package 103 (see FIGS. 9–10 and 19). These filler pallets allow a drive manufacturer to test fewer devices at a time than would be necessary to complete the wall. That is, the filler pallets 120 may substitute for "standard" pallets, thereby allowing the user to test an arbitrary number of devices in one batch. These filler pallets 120 may be particularly desirable for use in the exterior slots 106b to further isolate the devices under test from environmental noise.

Figure 11A:
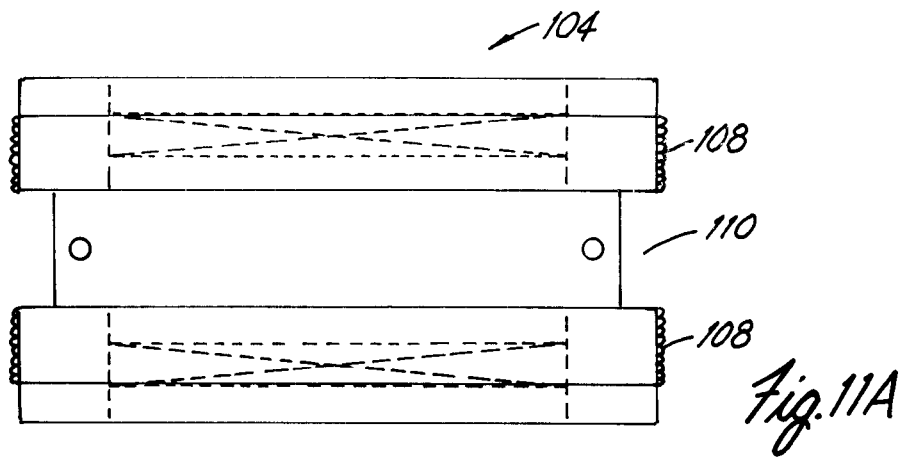
FIGS. 11A–11C are detailed top, front, and side plan views of an environmental chamber brick.
Figure 11B:
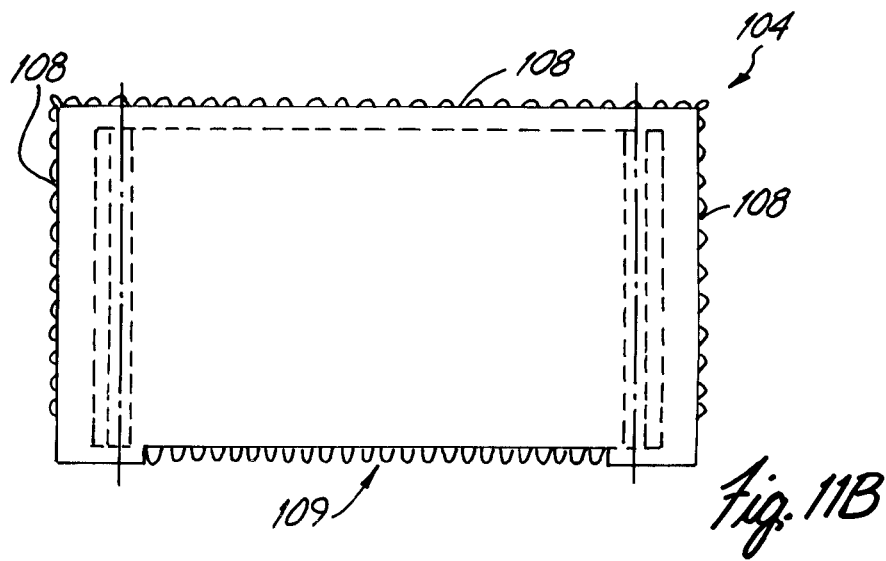
Figure 11C:
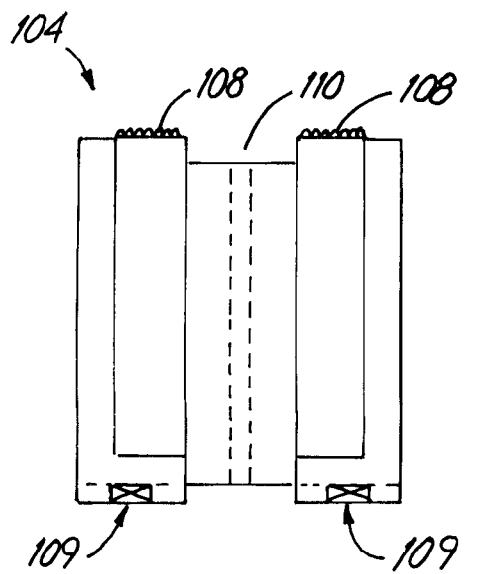

The insulating/air plenum brick 104 embodiment in FIG. 6 is about 3" thick, 3" high and 6" long, fabricated from a suitable lightweight insulating material, such as-expanded polystyrene foam (see also FIGS. 11A–C). Polystyrene foam is desirable for this application because it is lightweight, relatively durable, and inexpensive. However, other insulating materials are within the scope of the present invention. These include, without being limited to, polyethylene foam, urethane foam, ethylene vinyl acetate ("EVA") foam, asbestos, cork and other woods, organic bonded glass fibers, foam rubber, sponge rubber, and metallic foil laminates.

The two ends and top of the bricks 104 in this embodiment have a pair of strips of sealing material, such as a nylon "hook and loop" material 108 having the "loop" strips, near their outer edges. These strips are desirable because they form a seal or diffusion barrier between the testing space (A) and the tester space (C). The bottom of the brick 104 may have a similarly placed pair of seals 109 fabricated from a compliant sealing material capable of sealing between the flat cables 102, such as an ethylene propylene diene monomer ("EPDM") sponge rubber available from McMaster Carr of Chicago, Ill. Although EPDM is desirable for the bottom seal 109 because it is very resistant to chemicals, can withstand high temperatures for extended periods, and remains stable for long periods of time, other sealing materials are within the scope of this invention.

The bricks 104 in this embodiment have a groove 110 (see FIGS. 7, 11A–11C, and 19) of about 1" wide by ⅜" deep cut into their side surfaces. The grooves 110 on each brick cooperate with those on the neighboring bricks and with the walls of the test chamber to provide a plenum network for purge air. Pressurizing these air plenums with an appropriate gas, such as warm dry air, places the wall space (B) under positive pressure relative to either the test side A or the electronic control side C. This positive pressure prevents to prevent air from the testing space (A) and the tester space (C) from crossing the wall space (B), which in turn, helps both sides or chambers to be maintained under independent conditions of temperature and humidity.

One advantage of the modular pallet 100 is that the corresponding environmental test chamber can be quickly and inexpensively modified to test different devices. The modular pallet embodiment is also desirable because the corresponding environmental test chamber can test different combinations of devices at the same time. That is, some of the pallets placed in the chamber during a particular testing "run" may contain a first type device under test and others may contain a second type of device under test. The exact percentage of the first type and the second type may even be changed between different runs. Flexible manufacturing plants may find this feature particularly useful because they can use the same test-chamber with their entire production.

III. Environmental Test Chamber

Figure 8:
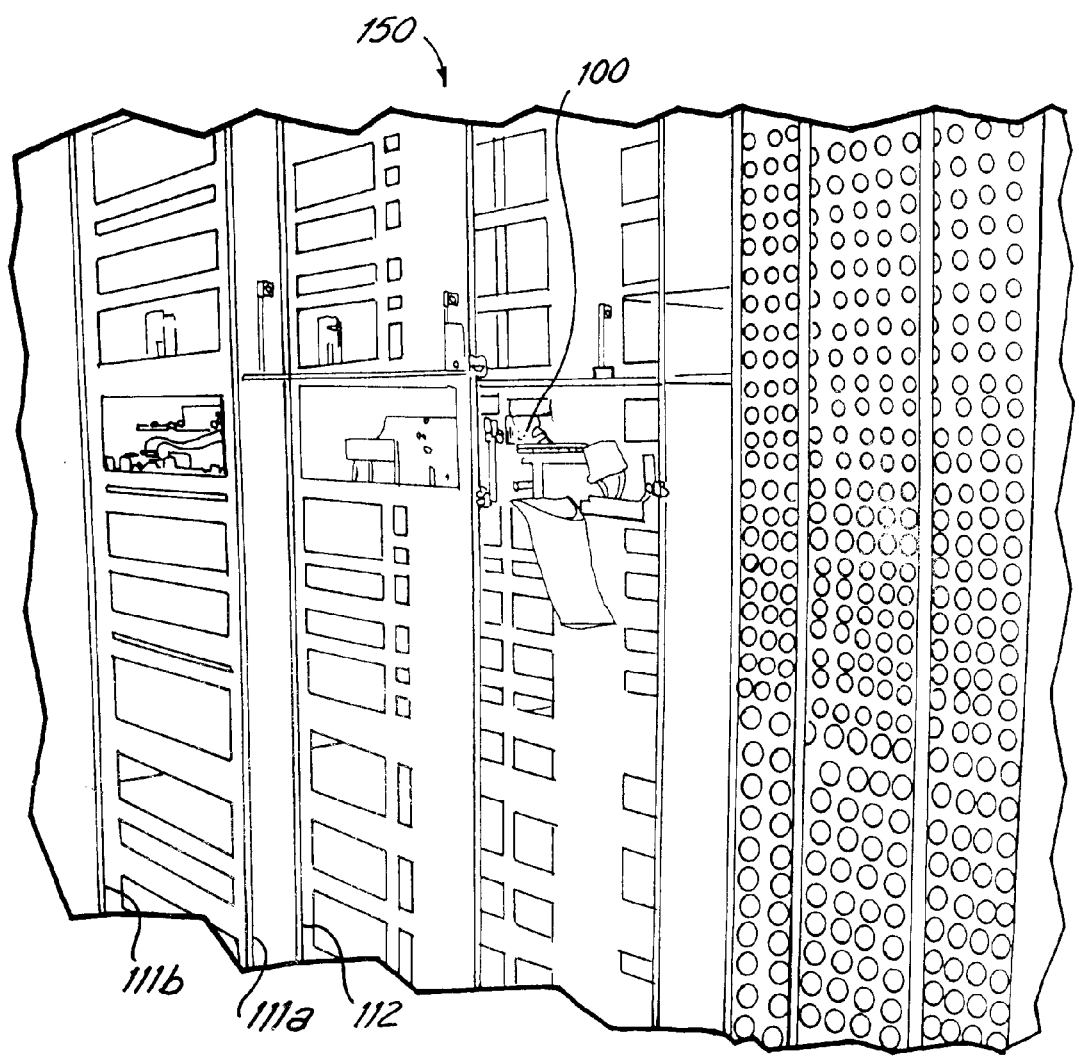
FIG. 8 is a perspective view of an environmental test chamber frame embodiment containing one pallet.
Figure 9:
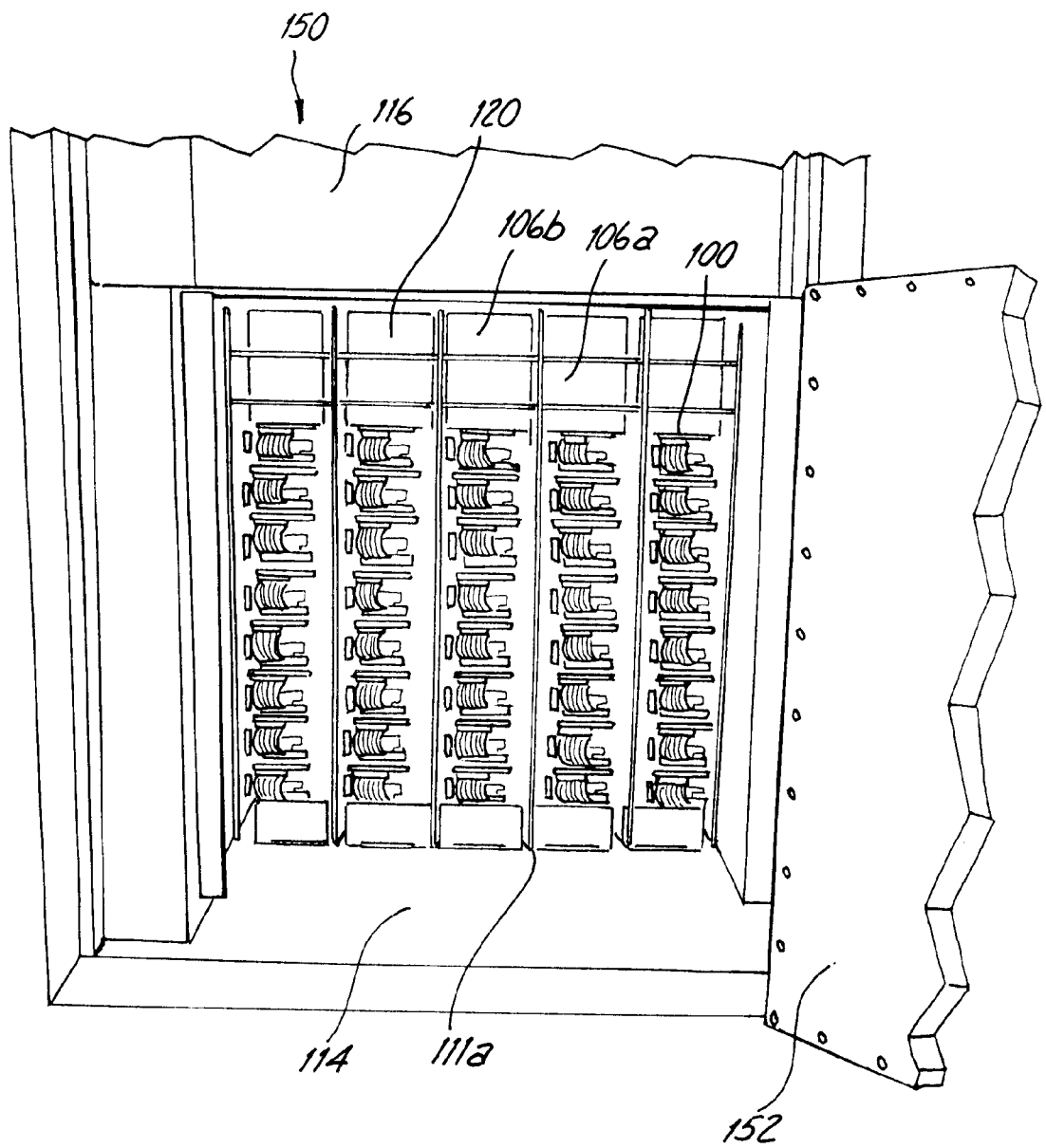
FIG. 9 is a front view of an environmental test chamber frame embodiment containing a plurality of pallets.
Figure 10:
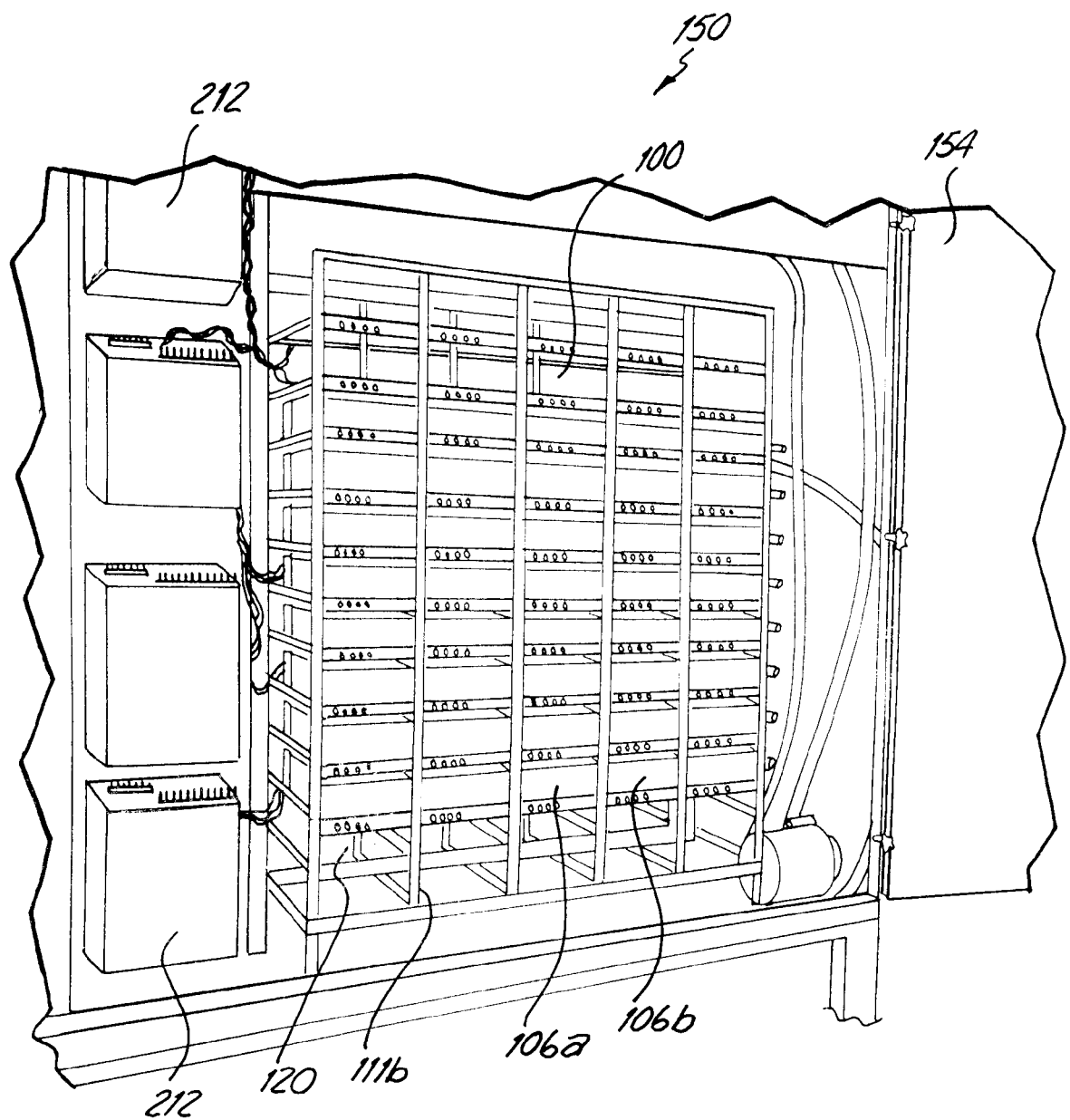
FIG. 10 is a perspective rear view of an environmental test chamber frame containing a plurality of pallets and a test interface device.
Figure 14:
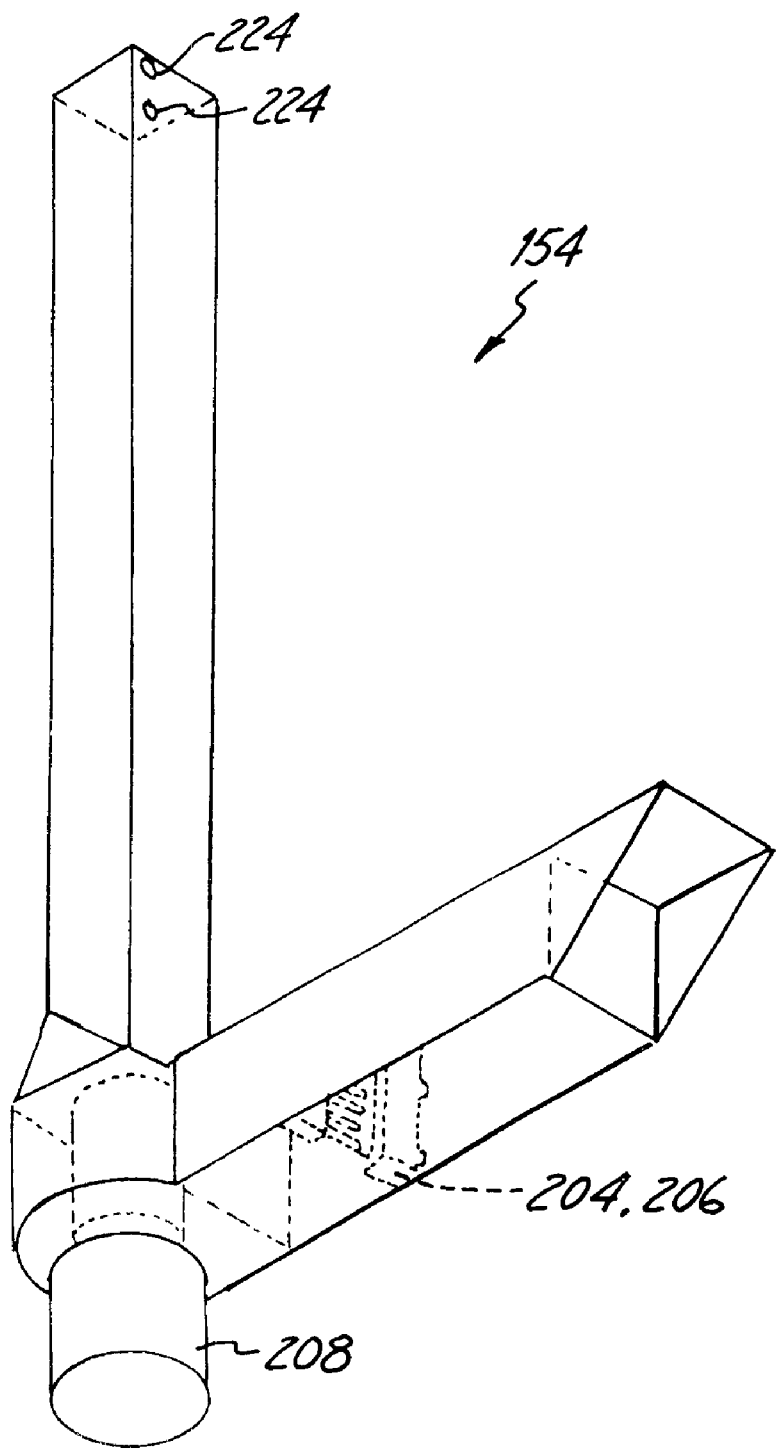
FIG. 14 is an isometric view of a single plenum temperature control system.

FIGS. 8–10 depict an environmental test chamber embodiment 150. This test chamber embodiment 150 comprises a front frame 111a and a rear frame 111b that extend between a base plate 114 and a header 116. The frames 111a and 111b define the plurality of pallet supporting slots 106, which are arranged in a grid. This test chamber 150 also comprises insulating studs 112 that further support the front frame 111a and the rear frame 111b. The environmental test chamber also includes a main access door 152 and two air handlers 154 (such as that shown FIG. 14) capable of delivering air at a desired flow rate, temperature, and humidity.

In operation, a user will insert the pallets 100 into the slots 106, which then cooperate to form a testing chamber in the rear portion of the chamber 150. The user will then close the main access door 152, thereby forming a tester chamber for the test driver components in the front portion of the chamber 150. Finally, the user will activate the air handlers 154. The air handlers 154 deliver separate air flows to the test chamber and the tester chamber, which allows independent control of the temperature and humidity in both chambers.

Figure 18:
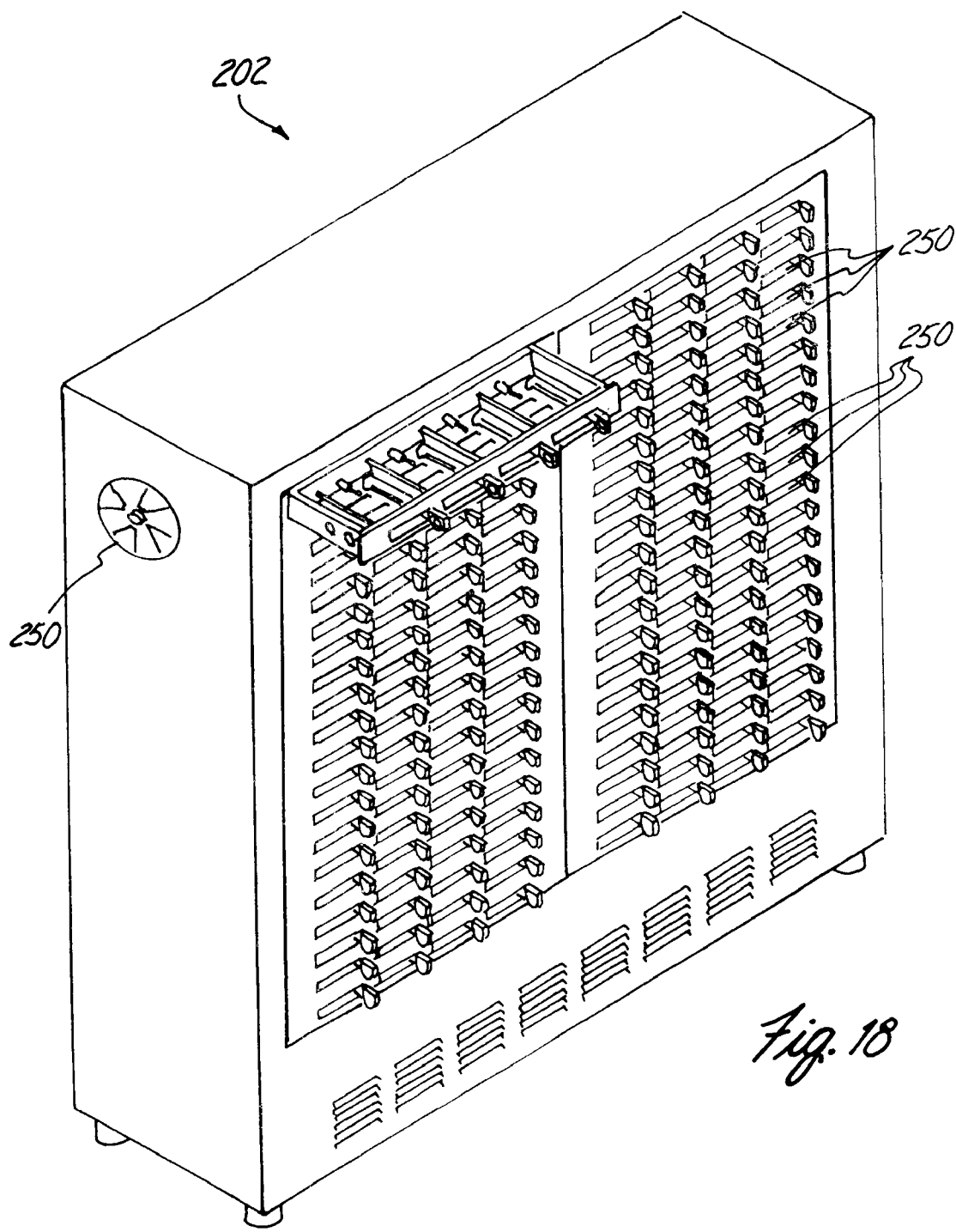
FIG. 18 is an isometric view of a environmental test chamber having a plurality of drawers.

FIG. 18 depicts an alternate environmental test chamber embodiment 202. As will be discussed in more detail below, this test chamber embodiment 202 has a dual plenum air supply system 200 and a plurality of drawers 250. One drawer 250 is positioned for servicing and changing fixtures and/or cables. The remaining drawers 250 are positioned in a testing or operational position. In addition to the advantages described above, this test chamber embodiment 202 is desirable because it provides: (i) a dual plenum system for supplying hot and cold pressurized mixed air at a controlled temperature gradient or at a fixed temperature; (ii) the ability to test in small batches, thus decreasing average test cycle time; (iii) high uniformity/stability of the target conditions and fast temperature ramp rates due to its use of a small test chamber volume, high air flow, and continuous feedback; (iv) the ability to run hot and cold tests can be run simultaneously in any number of drawers 250 in embodiments where each drawer, or nest of drawers, is fed by an independently controlled mixing plenum system; (v) a substantial reduction of internal temperature gradients provided by the small volume/tight control operating philosophy; and (vi) a highly compact, stackable design that can be placed back-to-back with another test chamber 202.

A. Small Batch Testing

FIG. 12 is an isometric view of a drawer 250 that is suitable for use with the environmental test chamber 202. This drawer embodiment 250 comprises four pallets 100, such as those described with reference to FIGS. 6–7, that are permanently mounted on a shelf 252. The pallets 100 and the shelf 252 are designed to seal against adjacent drawer(s) 250 and/or the interior of the test chamber 202, thereby creating a substantially sealed testing subchamber 254. Each subchamber 254 has two inlet orifices 224 in one side wall 256, two outlet orifices 226 in the opposite side wall 258, and its own temperature/humidity/air flow sensor 210.

In operation, a disk drive manufacturer can load four drives in each drawer 250, through the front of the drawer 250. Air enters the resulting subchamber 254 from the inlet orifices 224, circulates around the four drives, and exits through the outlet orifices 226. These embodiments are desirable because each subchamber 254 acts as a separate mini-environmental test chamber, which decreases the test's batch size. That is, the environmental conditions in each subchamber 254 are substantially independent of the presence or absence of other drawers 250 in the test chamber 202 and substantially independent of the environmental conditions in the other drawers 250. This allows the manufacturer to insert one drawer 250 into the test chamber 202, bring that drawer's subchamber 254 up to the desired testing conditions, and to conduct the desired test—all without having to completely fill the entire chamber 202 with disk drive or filler pallets. Thus, the manufacturer can perform a test on some drives while simultaneously loading other drives into another drawer 250. This feature is desirable because it can decrease the average amount of time necessary to conduct the tests and because it reduces the mass that must be heated or cooled to preform each test, as only the specific occupied drawers are maintained at the desired test environment.

In some embodiments, the inlet orifices 224 admit blended air from a single mixing chamber 218 and the outlet orifices 226 allow air to exit to a single return plenum 225. The sensors 210 associated with each drawer 250 provide a control computer 212 (FIG. 13) with continuous temperature, humidity, and air flow rate information about the subchamber 254. The control computer 212, in turn, adjusts the air handling system to produce optimum uniformity and stability in target temperatures. In these embodiments, the orifices, plenums, control system, and drawers should be designed produce a small test volume, high air flow, and continuous feedback. This combination will help maximize temperature uniformity and stability despite the changing operating conditions in chamber 202.

In other embodiments, the sensors 210 can be used to individually control the environmental conditions in each subchamber 254 or in small groups of subchambers 254. These embodiments may be desirable because hot and cold tests can be run simultaneously in any number of drawers 250 and because the individual controls will further improve uniformity and stability of the target temperatures.

B. Temperature and Air Flow Rate Control

FIG. 13 is an isometric view of a dual plenum air system embodiment 200 suitable for use with the environmental test chamber 202. This air plenum system 200 comprises a cold air supply duct ("cold air plenum") 204 and a hot air supply duct ("hot air plenum") 206, both of which are pneumatically connected to a fan or blower 208 by a flow divider. The hot air plenum 206 has a heating element 209 and can supply air at any reasonably defined temperature above the desired test chamber temperature. The cold air plenum 204 has a cooling element 214 and can supply air at any reasonably defined temperature below the desired test chamber temperature. The hot and cold air plenums 204 and 206 supply a mixing chamber 218, which mixes and blends the hot and cold air streams into a uniform air stream at the target temperature and humidity. This mixing chamber 218 includes two computer controlled dampers 219 and a variable speed fan or blower 220, and is pneumatically connected to the environmental test chamber 254 by the inlet orifices 224 associated with each drawer 250 (FIG. 12). The outlet orifices 226, in turn, allow air to pass from the testing subchamber 254 into a return plenum 225. The air plenum system 200 in some embodiments may also include a humidifier 227, additional computer controlled baffles or dampers 228, and a computer control system 212. This control system 212 is operably connected to a temperature, humidity, and air flow rate sensor 210 located inside the environmental test chamber 254, to the dampers 219 and 228, to the variable speed fan 220, and to the humidifier 227, and to the heating 209 and cooling 214 elements.

In operation, the fan 208 draws air from the return plenum 225 and/or the ambient air outside the chamber 254, and forces it into the cold air plenum 204 and the hot air plenum 206. The air entering the cold air plenum 204 passes over the cooling element 214, where it can be cooled to a temperature below the desired test chamber temperature. Those skilled in the art will recognize that this can cause water to condense out of the air stream, which decreases the air stream's humidity ratio. The air stream entering the hot air plenum 206 similarly passes over the heating element 209 and is heated above the desired test chamber temperature.

After the air passes through the cold air plenum 204 and the hot air plenum 206, the two air streams are combined and blended together in the mixing chamber 218. The mixing chamber includes two computer controlled air dampers 219, one for the cold air plenum 204 and one for the hot air plenum 206, that are operably connected to the control system 212. The control system 212 can use a signal from the temperature/humidity sensor 210 to actuate the dampers 219. This, in turn, adjusts the respective flow rates of the hot and cold air streams. The end effect is similar to the mixing faucet on a kitchen sink, only with the fluid being air rather than water. In some embodiments, the control system 212 also controls the operation of the humidifier 227 (not shown), which allows it to selectively increase the humidity of the blended air stream.

The fan 220 draws air from the mixing chamber 218 and pushes it through the inlet orifices 224, into the environmental test chamber 254. After the air has circulated around the devices under test, it exits the test chamber 254 through the outlet orifices 224. A damper 228 in the return plenum 225 can then either direct the air stream back into the fan 208, vent it to atmosphere, or a combination thereof, depending on which choice is the more energy efficient for the desired test conditions.

The heating element 209 may be any device capable of heating the air stream flowing through the hot air plenum 206. Suitable devices include, without being limited to, an electrical heating element or a heat exchanger connected to supply of hot water or steam. The cooling element 214 may similarly be any device capable of cooling the air stream flowing through the cold air plenum 204. Suitable devices include, without being limited to, a heat exchanger connected to a supply of chilled water or may be a vapor-compression cycle refrigeration unit. The temperature/humidity/air flow sensors 210 may be any device, or combination of devices, capable of sensing the temperature, humidity, and air flow inside the test chamber or chambers.

The baffles or dampers 219 and 228 can be any device, or combination of devices, that can control and change the flow rate of air through a duct. Computer controlled baffles or dampers 219 and 228 are particularly desirable because they will allow a user to quickly and easily change the conditions inside the test chamber 254. However, manually actuated devices 219 and 228 are also within the scope of the present invention.

The air delivery system in FIG. 13 is depicted as vertically surrounding a cluster of drawers 250 (FIG. 12). These vertical embodiments are desirable because the air delivery system 200 can be easily built around the test chamber 254 such that the chamber/air delivery system form a single, integrated unit. However, the air delivery system 200 could be located at any other angle relative to the drawers 250 and could feed one drawer 250 or a plurality of drawers 250.

The control system 212 can be any device or combination of devices capable of maintaining the conditions inside the test chamber(s) at or near the target conditions. In some embodiments, the control unit 212 is an microprocessor implemented active feedback control system that uses the signal from the sensors 210 to operate the dampers 219 and 228, the variable speed fan 220, and the humidifier 227.

Other suitable controllers include, but are not limited to, an analog or digital feedback device running an appropriate control algorithm.

Many variations of the embodiment in FIG. 13 are within the scope of the present invention. For example, the cooling element 214 may be eliminated. The cold air plenum 204 in this embodiment will then supply either ambient room temperature air or return temperature air to the mixing chamber 218, depending on which is more energy efficient for the desired test conditions. In addition, the present invention may include a flow straightener between the mixing chamber and the inlet orifice 224. This flow straightener can be any device capable of reducing or eliminating the turbulence caused by the fan 220. Suitable devices include, but are not limited to, a bank of tubes or honeycomb structure that forms a plurality of small diameter flow paths. The flow straightener may be desirable for its potential to reduce vibrations caused by uneven air flow.

Figure 15:
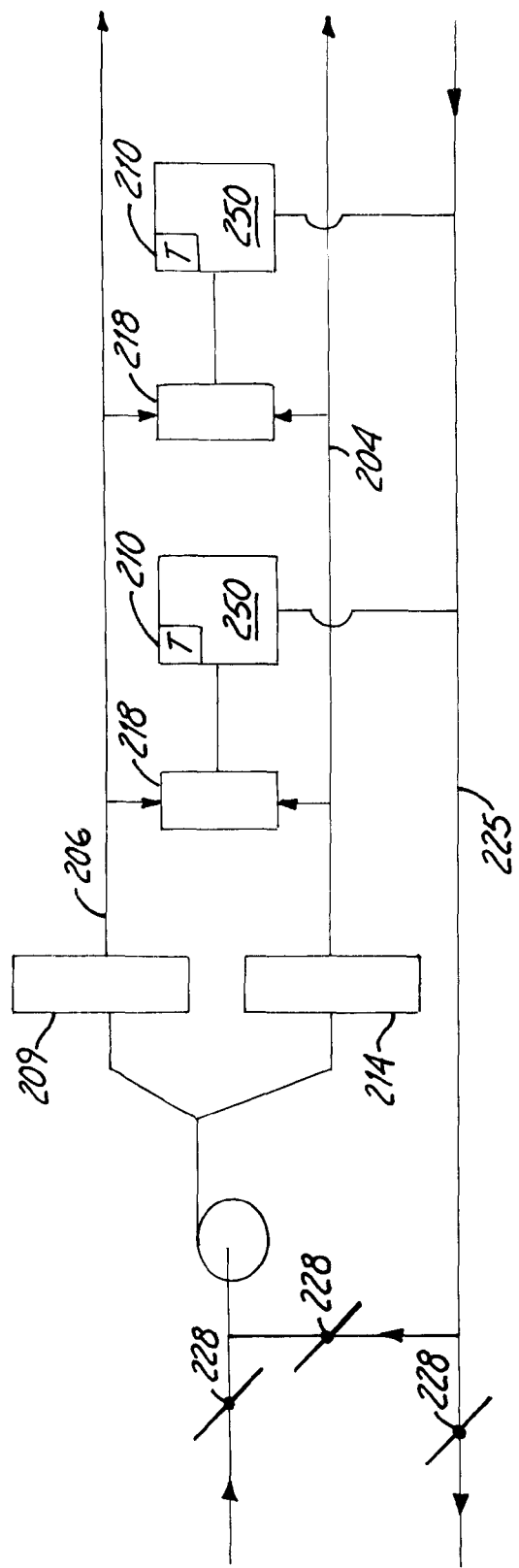
FIG. 15 schematically illustrates a multizone dual duct embodiment.
Figure 16:
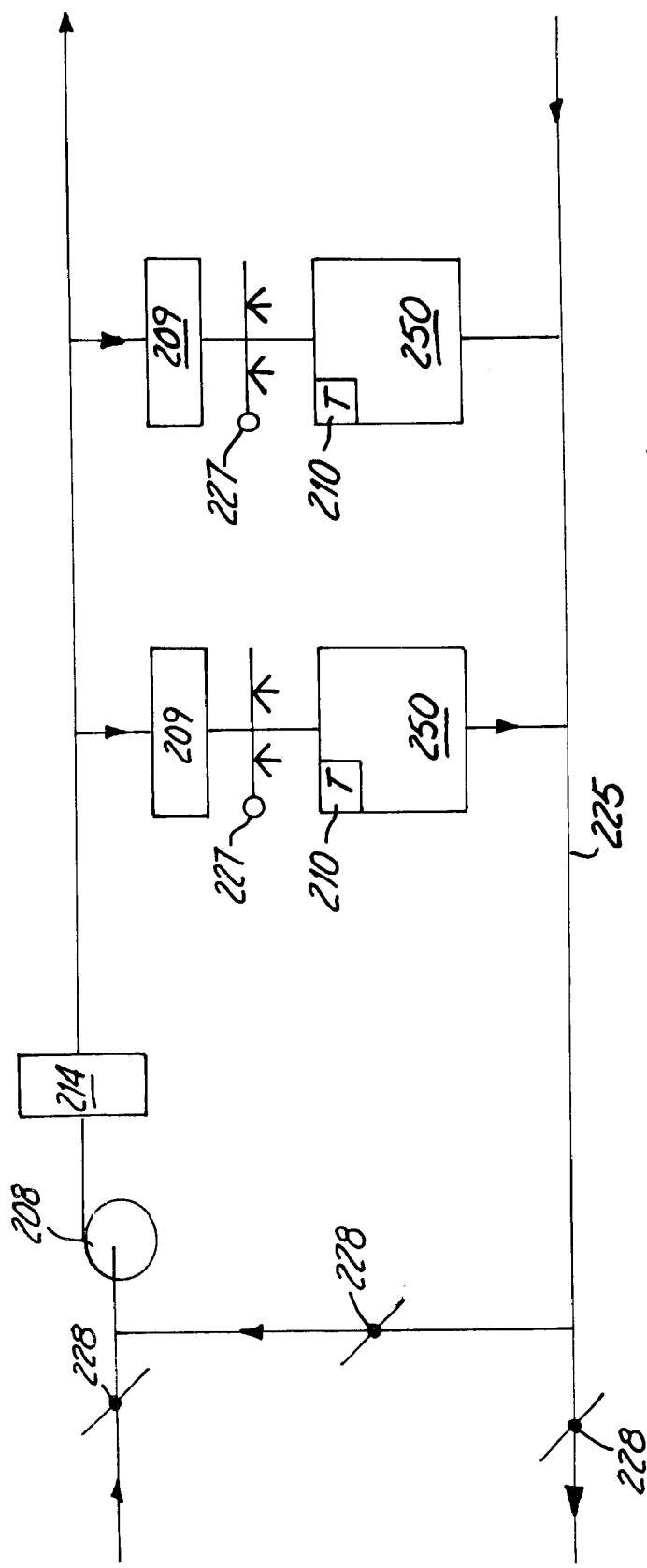
FIG. 16 schematically illustrates a multizone thermal-reheat embodiment.
Figure 17:
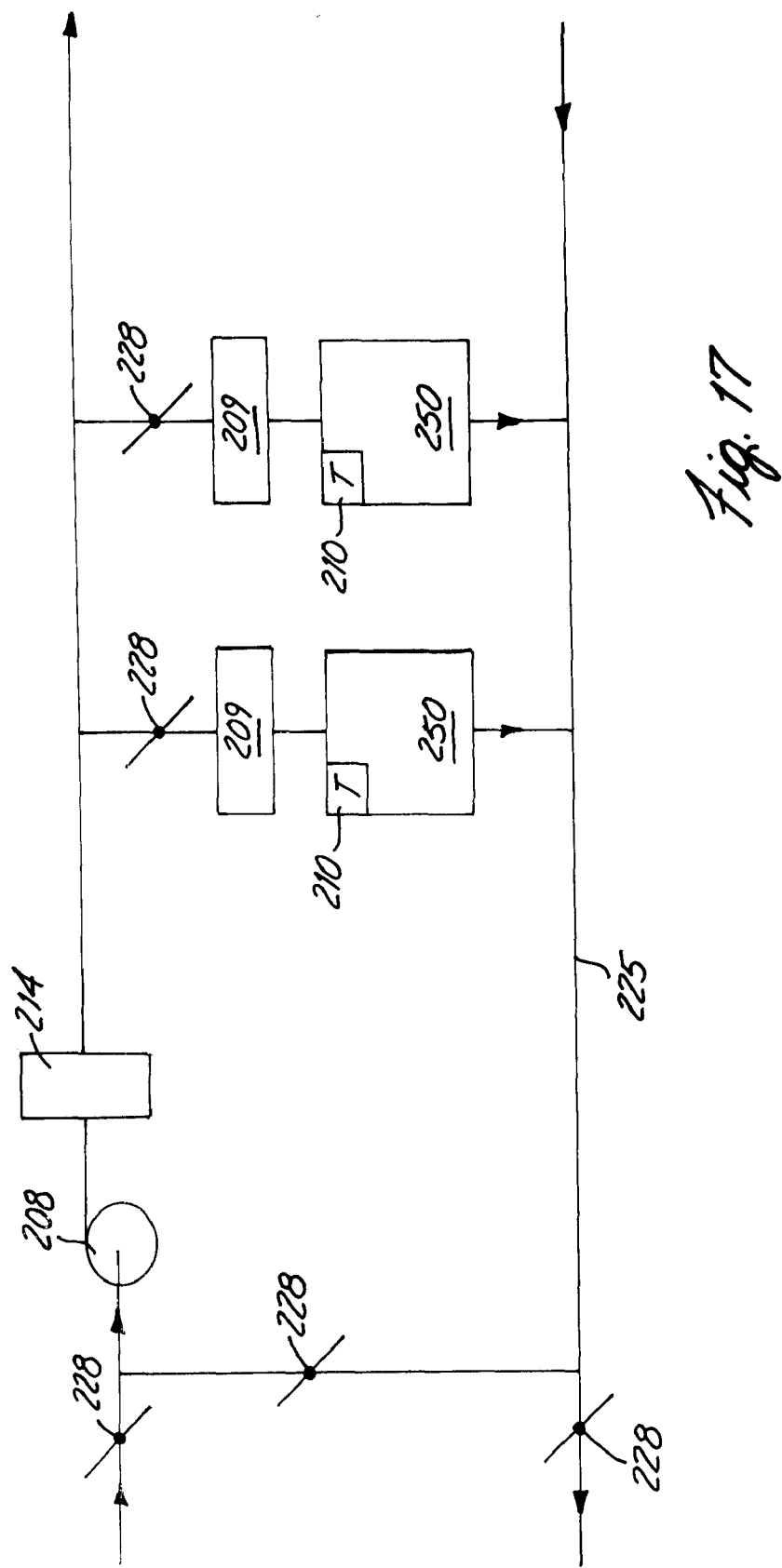
FIG. 17 schematically illustrates an alternate variable-air-volume system.

FIGS. 15, 16 and 17 schematically depict alternate air delivery system embodiments suitable for use with the multiple, independently controllable subchambers 254 described with reference to FIGS. 12 and 13. Specifically, FIG. 15 depicts a dual duct variable-air-volume ("VAV") system in which each subchamber 254 has its own mixing chamber 218. FIG. 16 depicts a multizone single plenum system with terminal reheat. In this embodiment, all of the air is cooled to a temperature low enough to assure dehumidification. The sensor 210 in each subchamber 254 is used to control its associated reheat coil 209 to insure that the air entering each subchamber 254 is at the proper temperature and humidity. FIG. 17 depicts a single plenum VAV system with terminal reheat. Terminal reheat systems like those shown in FIGS. 16 and 17 may be desirable because they only require a single duct. This feature can decrease the system's initial cost and complexity. Dual duct systems like that shown in FIG. 15, however, are more energy efficient. This will decrease the system's operating costs.

One particular embodiment of the present invention incorporates all three aspects described above designed and operates in a synergistic manner to produce excellent uniformity of temperature/humidity and air flow on the test side and minimal heat transfer between the test and tester sides due to the excellent thermal insulation provided by the bricks, their framework, the constructed the air plenum system, and the warm dry air purge pushed into the plenum. In this embodiment, the pallet 100 is fabricated from cold rolled steel, the framework 111*a* and 111*b* is fabricated from cold rolled steel, powder coated; the insulated studs 112, the base plate 114 and header 116 are fabricated from a grade XX paper/phenolic laminate sold under the trade name GAROLITE by McMaster Carr of Chicago, Ill.; the insulating bricks 104 are fabricated from the RayLite® brand expanded polystyrene produced by DiversiFoam Products of Rockford, Minn.; the rubber seals are fabricated from EPDM sponge rubber; and the brick 104 top and side closure are fabricated from the "loop" material of nylon "hook and loop" fabric.

Although the present invention has been described in detail with reference to certain examples thereof, it may be also embodied in other specific forms without departing from the essential spirit or attributes thereof. For example, although present invention have generally been described with reference to a computer hard drive, and in particular for environmental testing of 3.5 inch and 2.5 inch, disk drives, the principles could be extended to controlled environment testing of other devices. These include, without being limited to, compact disk ("CD" or "CD-ROM") drives, digital video disk ("DVD") drives, tape drives, "cards" for computer peripherals, computer memory chips, integrated circuit wafers, personal computer devices, consumer electronics, etc. Aspects of the present invention can also be used as an incubator, or the like, in biological manufacturing processes and testing. In addition, the carrier and/or the pallets may include auxiliary fan designed to improve airflow around the device under test. Therefore, it is desired that the embodiments described herein be considered in all respects as illustrative, not restrictive, and that reference be made to the appended claims for determining the scope of the invention.

What is claimed is:

1. An environmental test chamber, comprising:
   plurality of pallets; and
   a plurality of insulation bricks associated with the plurality of pallets, the insulation bricks having a sealing material comprised of a strip of hook and loop material and the insulation bricks cooperating to form an insulating barrier.

2. An environmental test chamber, comprising:
   a plurality of pallets; and
   a plurality of insulation bricks associated with the plurality of pallets, the insulation bricks having a sealing material comprised of a sponge rubber and the insulation bricks cooperating to form an insulating barrier.

3. The environmental test chamber of claim 2, wherein the pallets are adapted to receive a device under test and a testing apparatus, and wherein the insulating barrier is located between the device under test and the testing apparatus.

4. The environmental test chamber of claim 2, further comprising a rack adapted to receive the plurality of pallets.

5. An environmental test chamber comprising
   a frame defining a testing space and a tester space; and
   a plurality of insulation bricks received by the frame, the insulation bricks cooperating to form an insulating barrier between the testing space and the tester space and a plenum network.

6. The chamber of claim 5, wherein the frame defines an interior receiving slot and an exterior receiving slot.

7. The chamber of claim 5, wherein each insulation brick includes grooves along it side surfaces, and wherein the grooves cooperate to provide the plenum network.

8. The chamber of claim 5, wherein each insulation brick is disposed within a pallet, and wherein the frame is adapted to receive the pallet.

9. The chamber of claim 5, wherein the tester space includes an electronic testing package.

10. The chamber of claim 5, wherein each insulation brick includes a wall located between each testing space and each tester space, and wherein each wall cooperates with each other and with the frame to insulate each testing space from each tester space.

11. The chamber of claim 5, wherein each test space includes a fixture for holding a device under test.

12. The chamber of claim 5, and further comprising an air source in communication with each insulation brick.

13. The chamber of claim 12, wherein the air source regulates temperature.

14. The chamber of claim 12, wherein the air source regulates humidity.

15. The environmental test chamber of claim 5, wherein the insulation bricks define a plenum.

16. The environmental test chamber of claim 5, wherein the insulation bricks include a sealing material.

* * * * *

UNITED STATES PATENT AND TRADEMARK OFFICE
CERTIFICATE OF CORRECTION

PATENT NO. : 6,526,841 B1
DATED : March 4, 2003
INVENTOR(S) : Wanek et al.

It is certified that error appears in the above-identified patent and that said Letters Patent is hereby corrected as shown below:

<u>Title page,</u>
Item [75], Inventors,
Reads
"Donald L. Wanek, Rochester, MN (US)
Loren L. Swanson, Kasson, MN (US)
Richard L. Sands, Rochester, MN (US)
Mark Troutman, Rochester, MN (US)
James A. Melville, Mantorville, MN (US)"
Should read
-- Donald L. Wanek, Rochester, MN (US)
Loren L. Swanson, Kasson, MN (US)
Richard L. Sands, Rochester, MN (US) --

<u>Column 8,</u>
Line 20, reads "This, turn, causes" should read -- This, in turn, causes --

Signed and Sealed this

First Day of July, 2003

JAMES E. ROGAN
*Director of the United States Patent and Trademark Office*